(12) United States Patent
Irie et al.

(10) Patent No.: US 10,656,477 B2
(45) Date of Patent: May 19, 2020

(54) LIQUID CRYSTAL DISPLAY DEVICE

(71) Applicant: Sakai Display Products Corporation, Sakai-shi, Osaka (JP)

(72) Inventors: Kentaro Irie, Sakai (JP); Masae Kitayama, Sakai (JP)

(73) Assignee: Sakai Display Products Corporation, Sakai-shi, Osaka (JP)

( * ) Notice: Subject to any disclaimer, the term of this patent is extended or adjusted under 35 U.S.C. 154(b) by 0 days.

(21) Appl. No.: 15/753,951

(22) PCT Filed: Aug. 27, 2015

(86) PCT No.: PCT/JP2015/074294
§ 371 (c)(1),
(2) Date: Feb. 20, 2018

(87) PCT Pub. No.: WO2017/033341
PCT Pub. Date: Mar. 2, 2017

(65) Prior Publication Data
US 2018/0252971 A1    Sep. 6, 2018

(51) Int. Cl.
*G02F 1/1343* (2006.01)
*G09G 3/36* (2006.01)
(Continued)

(52) U.S. Cl.
CPC ...... *G02F 1/134336* (2013.01); *G02F 1/1368* (2013.01); *G02F 1/133528* (2013.01);
(Continued)

(58) Field of Classification Search
CPC .................................................. G02F 1/13624
See application file for complete search history.

(56) References Cited

U.S. PATENT DOCUMENTS 8,952,877 B2   2/2015 Kim et al.
2008/0198285 A1  8/2008 Hsieh et al.
(Continued)

FOREIGN PATENT DOCUMENTS

JP    2008-203849 A   9/2008
WO    2011/065058 A1  6/2011
WO    2011/093374 A1  8/2011

OTHER PUBLICATIONS

Kim et al. "'82' Ultra Definition LCD Using New Driving Scheme and Advanced Super PVA Technology", SID Symposium Digest of Technical Papers, May 2008, vol. 39, Issue 1, pp. 196-199.

*Primary Examiner* — Alexander P Gross
(74) *Attorney, Agent, or Firm* — Rudy J. Ng; Bret E. Field; Bozicevic, Field & Francis LLP

(57) ABSTRACT

Each of pixels arranged in a matrix has at least first and second subpixels defined to include an electrode pair of a subpixel electrode and a counter electrode facing each other with a liquid crystal layer interposed therebetween. A scanning signal is applied from a scanning signal line of each row of the matrix to a gate electrode of a TFT for applying a data signal from a source signal line to the subpixel electrode included in each of the first and second subpixels. A discharge capacitor electrode is connected to the subpixel electrode of the second subpixel through another TFT. When the signal width of the scanning signal is within a range from M times (M is 0 or 1) the length of 1 H to (M+1) times, a discharge signal line is connected to the scanning signal line, which is scanned after N horizontal scanning periods (N is M+2, that is, 2 or 3), by a signal-to-signal connection line.

2 Claims, 23 Drawing Sheets

(51) Int. Cl.
    *G02F 1/1362*    (2006.01)
    *G09G 3/00*     (2006.01)
    *G02F 1/1335*    (2006.01)
    *G02F 1/1368*    (2006.01)
    *H01L 27/12*    (2006.01)
    *G02F 1/136*     (2006.01)

(52) U.S. Cl.
    CPC ......... *G02F 1/136213* (2013.01); *G09G 3/00* (2013.01); *G09G 3/3611* (2013.01); *G09G 3/3648* (2013.01); *G09G 3/3655* (2013.01); *G09G 3/3677* (2013.01); *H01L 27/124* (2013.01); *G02F 1/13624* (2013.01); *G02F 1/136286* (2013.01); *G02F 2001/13606* (2013.01); *G09G 2300/0426* (2013.01); *G09G 2300/0876* (2013.01); *G09G 2320/028* (2013.01); *G09G 2320/068* (2013.01)

(56) References Cited

U.S. PATENT DOCUMENTS

| | | | |
|---|---|---|---|
| 2009/0027325 A1* | 1/2009 | Kim | G02F 1/136286 345/92 |
| 2009/0207115 A1* | 8/2009 | Kim | G02F 1/13624 345/90 |
| 2012/0229723 A1* | 9/2012 | Katsuta | G02F 1/13624 349/42 |
| 2012/0320026 A1 | 12/2012 | Kitayama et al. | |
| 2013/0201166 A1 | 8/2013 | Wang et al. | |
| 2013/0328756 A1 | 12/2013 | Tsuei et al. | |
| 2015/0009465 A1* | 1/2015 | Park | G02F 1/133707 349/139 |
| 2015/0116300 A1* | 4/2015 | Yamaki | G09G 3/3696 345/212 |

* cited by examiner

F I G. 1 1
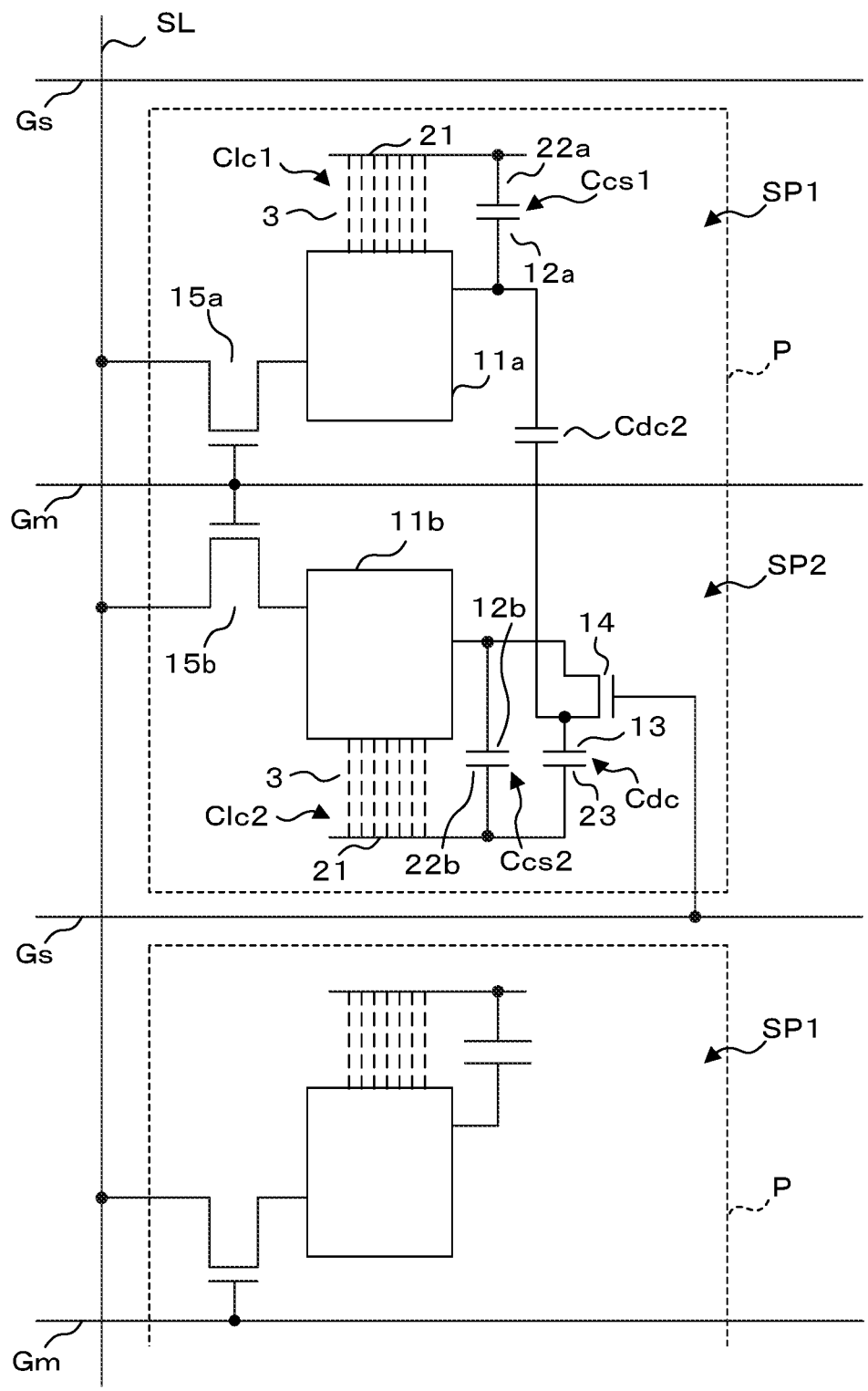

F I G. 1 6
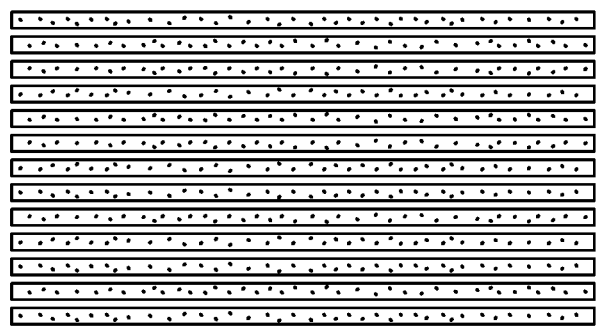
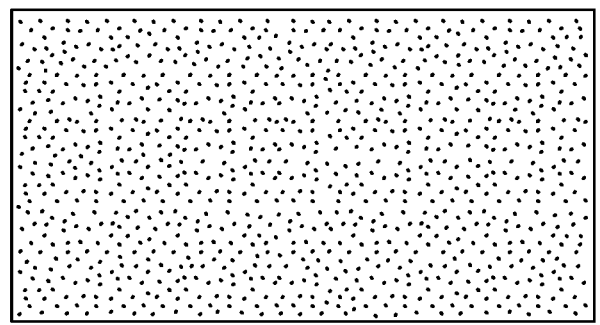

F I G. 1 9
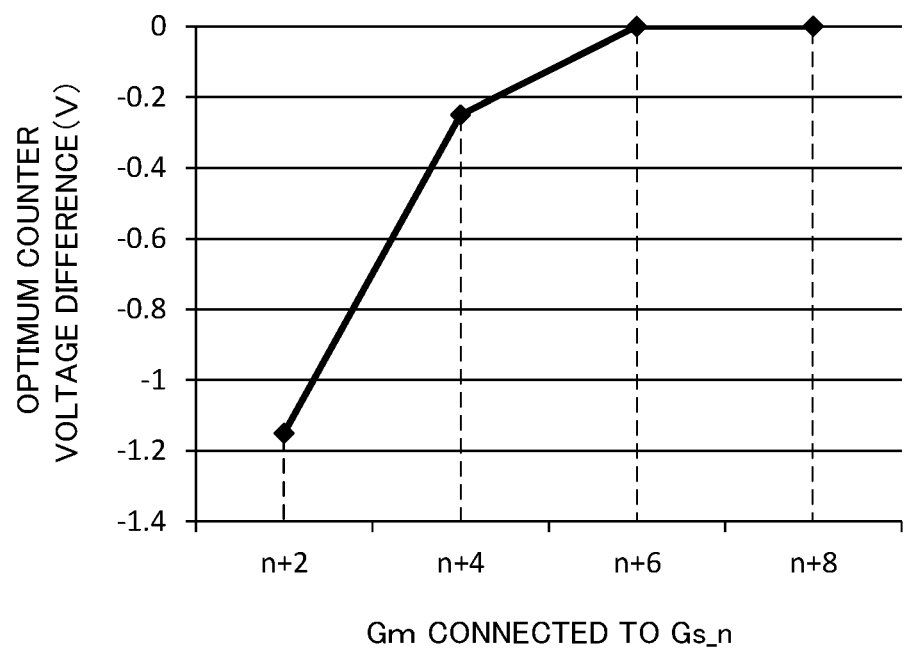

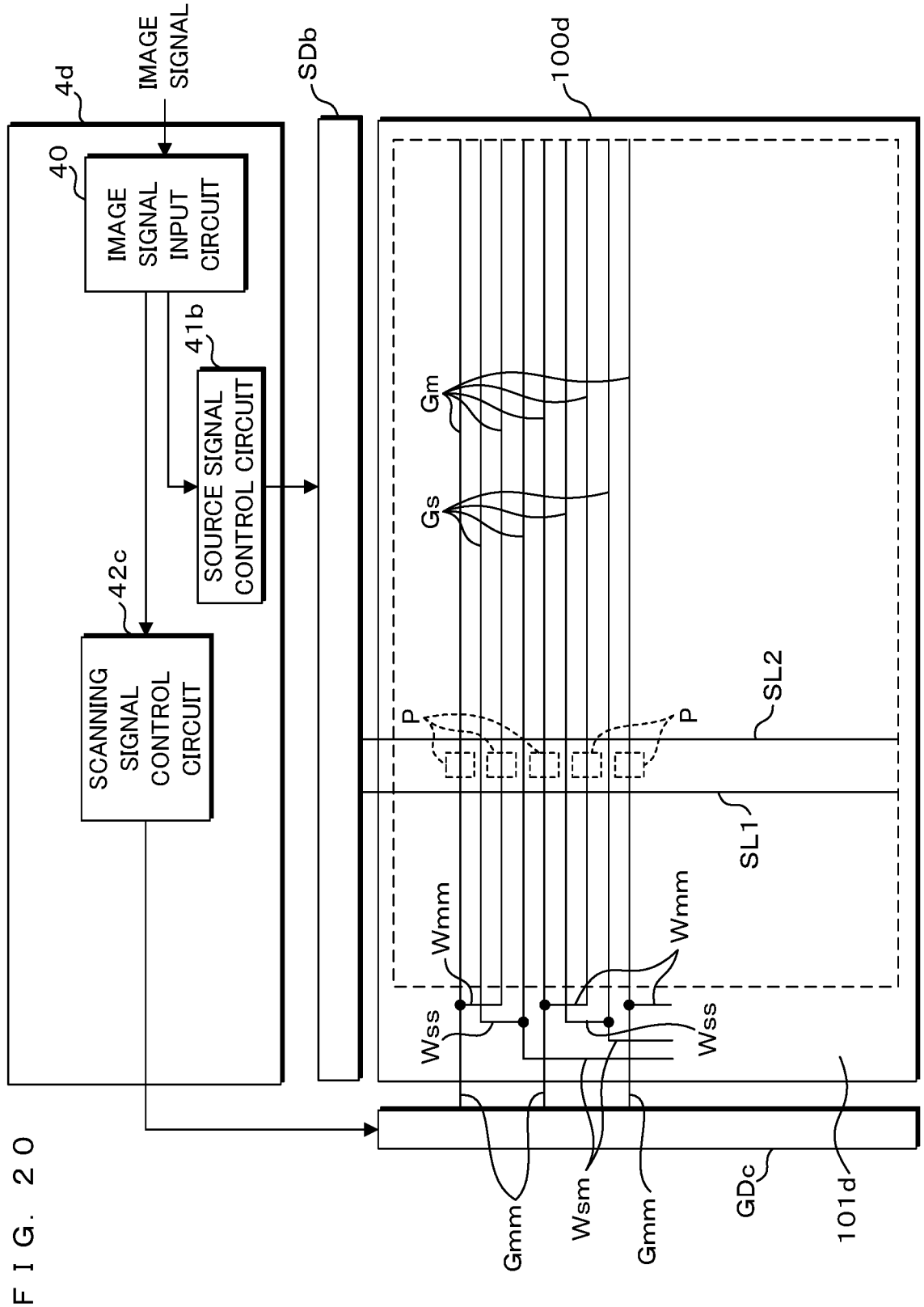

LIQUID CRYSTAL DISPLAY DEVICE

CROSS-REFERENCE TO RELATED APPLICATIONS

This application is the national phase under 35 U. S. C. § 371 of PCT International Application No. PCT/JP2015/074294 which has an International filing date of Aug. 27, 2015 and designated the United States of America.

FIELD

The present invention relates to a liquid crystal display device, and in particular, to a liquid crystal display device for improving the viewing angle dependence of the gamma characteristics.

BACKGROUND

The liquid crystal display device is a flat display device having excellent features, such as high definition, thin shape, light weight, and low power consumption, and is widely used for a flat TV, a PC monitor, a digital signage, and the like.

A twisted nematic (TN) mode liquid crystal display device that has been conventionally used in general is excellent in productivity, but has a problem in viewing angle characteristics relevant to screen display. For example, when the display screen is viewed from an oblique direction with respect to the normal line, the contrast ratio is significantly reduced and the brightness difference between gradations is significantly unclear in the TN mode liquid crystal display device. In addition, a so-called gradation inversion phenomenon may be observed in which a portion that looks bright (or dark) when the display screen is viewed from the front looks dark (or bright) when the display screen is viewed from an oblique direction with respect to the normal line.

As liquid crystal display devices for solving the problem of the viewing angle characteristics described above, there are liquid crystal display devices that perform display in display modes, such as an in-plan switching (IPS) mode and a multi domain vertical alignment (MVA) mode. Techniques for realizing the display modes in these liquid crystal display devices are widely used as techniques for improving the viewing angle characteristics.

Incidentally, one of problems of the viewing angle characteristics is that the gamma characteristics indicating the gradation dependence of the display brightness depend on the angle of the line of sight with respect to the normal line of the display screen (hereinafter, referred to as the viewing angle dependence of the gamma characteristics). This problem is that the gradation display state differs depending on the observation direction with respect to the display screen and accordingly the gamma characteristics are differently observed between a case where the observation direction is a direction along the normal line of the display screen and a case where the observation direction is an oblique direction with respect to the normal line of the display screen.

On the other hand, Non-Patent Document 1 (Sang Soo Kim, Bong Hyun You, Jung Hwan Cho, Sung Jae Moon, Brian H. Berkeley and Nam Deog Kim, '82" Ultra Definition LCD Using New Driving Scheme and Advanced Super PVA Technology', SID Symposium Digest of Technical Papers, May 2008, Volume 39, Issue1, p. 196-199) discloses a liquid crystal display device for improving the viewing angle dependence (referred to as viewing angle dependence in some documents) of the gamma characteristics. In the liquid crystal display device disclosed in Non-Patent Document 1, each pixel is configured to include first and second subpixels, and a discharge capacitor (Cdown) is provided in the second subpixel. Subpixel electrodes of the first and second subpixels are connected to data signal lines (source signal lines), which are different alternately for respective pixels in the vertical direction of the display screen, through TFT1 and TFT2 having control electrodes to which a scanning signal (gate signal) is applied from the scanning signal line, and two lines are simultaneously scanned. In the discharge capacitor, a discharge capacitor electrode facing a counter electrode is connected to the subpixel electrode of the second subpixel through a TFT3. In addition, a discharge signal line for applying a discharge signal to the control electrode of the TFT3 is connected to the scanning signal line behind two lines.

In the liquid crystal display device disclosed in Non-Patent Document 1, for each pixel, a discharge signal delayed by one horizontal scanning period (1 H) from the scanning signal for each pixel is applied to the control electrode of the TFT3. By connecting the discharge capacitor electrode and the subpixel electrode of the second subpixel according to the signal delayed by 1 H from the scanning signal in this manner, the effective voltage applied to the liquid crystal layer by each of the first and second subpixels can be changed. In this case, since each pixel is observed in a state in which the gamma characteristics that are different for respective subpixels are harmonized, the viewing angle dependence of the gamma characteristics is improved.

A liquid crystal display device disclosed in U.S. Pat. No. 8,952,877 is configured such that each pixel includes first and second subpixels, each of which has a subpixel electrode, similarly to the liquid crystal display device disclosed in Non-Patent Document 1, and a discharge capacitor (Cdown) is connected to the subpixel electrode of the second subpixel through a third TFT (corresponding to the TFT3 described above). Similarly to the case of Non-Patent Document 1, subpixel electrodes of the first and second subpixels are connected to data signal lines, which are different alternately for respective pixels, through first and second TFTs (corresponding to the TFT1 and the TFT2 described above), and two lines are simultaneously scanned. The control electrodes (gates) of the first and second TFTs are connected to a gate line (corresponding to the scanning signal line described above), and the control electrode of the third TFT is connected to a charge control line (corresponding to the discharge signal line described above).

In the liquid crystal display device disclosed in U.S. Pat. No. 8,952,877, for the two lines scanned simultaneously, gate lines are connected to each other through a gate connection line, and charge control lines are connected to each other through a charge connection line. Since these connections are made within the liquid crystal panel, the gate connection line and the charge connection line intersect with each other within the liquid crystal panel. The charge connection line is connected to a gate connection line for two lines scanned 1 H later than the above two lines. By such a connection, similarly to the liquid crystal display device disclosed in Non-Patent Document 1, a signal (corresponding to a discharge signal) delayed by 1 H from the scanning signal for each pixel is applied to the control electrode of the third TFT and the subpixel electrode of the second subpixel is connected to the discharge capacitor. As a result, the effective voltage applied to the liquid crystal layer by the second subpixel changes.

Incidentally, it is known that, in the TFT, due to the influence of the parasitic capacitance between the gate and the drain, a feed-through voltage (so-called pull-in voltage) is generated at the falling time of the driving voltage for the gate and the voltage of the drain (that is, the voltage of the subpixel electrode) drops. In addition to this phenomenon, due to the influence of another parasitic capacitance present between each subpixel electrode and the discharge signal line (or the charge control line), in particular, a phenomenon may be observed in which the voltage of the subpixel electrode of the first subpixel slightly rises and drops at the rising time and falling time of the discharge signal of the previous line.

For example, in a case where there is no signal overlap between the scanning signal and the discharge signal of the previous line, influences at the rising time and the falling time are appropriately canceled out in each subpixel electrode. For this reason, the above-described phenomenon is difficult to observe.

SUMMARY

However, in the liquid crystal display devices disclosed in Non-Patent Document 1 and U.S. Pat. No. 8,952,877, in two lines scanned simultaneously, the first subpixel of the first line is influenced by the discharge signal of the previous line that is turned on at the same timing as the scanning signal of the first line, and the first subpixel of the second line is influenced by the discharge signal of the first line that rises at substantially the same timing as the falling edge of the scanning signal of the second line.

Therefore, in any first subpixel, there is a possibility that the influences of rising and falling of the voltage of the subpixel electrode occurring at the rising time and the falling time of the discharge signal are not sufficiently canceled out. For this reason, there is a problem that a counter voltage, which is optimal for the counter electrode that the subpixel electrode faces, deviates from a preset counter voltage (hereinafter, referred to as counter voltage deviation).

The present invention has been made in view of the above circumstances, and it is an object of the present invention to provide a liquid crystal display device capable of preventing a counter voltage, which is optimal for a counter electrode that a subpixel electrode included in a pixel faces, from deviating from a preset counter voltage.

In a liquid crystal display device according to the present invention, pixels each of which has at least first and second subpixels defined to include an electrode pair of a subpixel electrode and a counter electrode facing each other with a liquid crystal layer interposed therebetween are arranged in a matrix. The liquid crystal display device includes: first and second switching elements for applying a data signal to subpixel electrodes included in the first and second subpixels; a scanning signal line for applying a scanning signal to control electrodes of the first and second switching elements for each row of the matrix; an electrode pair of a discharge capacitor electrode included in the second subpixel and a discharge capacitor counter electrode connected to a predetermined potential; a third switching element connected between the discharge capacitor electrode and the subpixel electrode of the second subpixel; and a discharge signal line for applying a discharge signal for turning on the third switching element to a control electrode of the third switching element for each row of the matrix. The signal width of the scanning signal is longer than M times (M is an integer of 0 or more) the length of one horizontal scanning period and shorter than (M+1) times, and a signal-to-signal connection line connecting the discharge signal line to a scanning signal line of a row, which is scanned after N horizontal scanning periods (N is an integer of M+2 or more), is provided.

In the liquid crystal display device according to the present invention, the first and second subpixels are arranged in a direction crossing the discharge signal line, and the discharge signal line is arranged between adjacent first and second subpixels in pixels adjacent to each other in the direction.

In the liquid crystal display device according to the present invention, the polarity of a data signal applied to the first and second subpixels is inverted every frame period.

In the liquid crystal display device according to the present invention, the signal width of the scanning signal is longer than a length obtained by subtracting a predetermined time from (M+1) times the length of one horizontal scanning period, and the signal-to-signal connection line is connected to a scanning signal line of a row scanned after L horizontal scanning periods (L is an integer of M+3 or more).

In the liquid crystal display device according to the present invention, each of the first and second subpixels is defined to include an electrode pair of an auxiliary capacitor electrode connected to the subpixel electrode and an auxiliary capacitor counter electrode connected to the predetermined potential.

In the liquid crystal display device according to the present invention, the pixel is defined to include an electrode pair having electrodes connected to the discharge capacitor electrode and the subpixel electrode of the first subpixel.

The liquid crystal display device according to the present invention further includes a liquid crystal panel in which the scanning signal line and the signal-to-signal connection line are wired in an edge portion, and the signal-to-signal connection line intersects with (N−1) scanning signal lines.

The liquid crystal display device according to the present invention further includes two data signal lines for applying data signals, which are different alternately for respective rows of the matrix, to one end of each of the first and second switching elements for each column of the matrix, and two adjacent rows are simultaneously scanned.

The liquid crystal display device according to the present invention further includes a liquid crystal panel in which the scanning signal line and the signal-to-signal connection line are wired in an edge portion, and the signal-to-signal connection line intersects with (2N−1) scanning signal lines.

The liquid crystal display device according to the present invention further includes: a scanning signal connection line connecting scanning signal lines to each other for the two rows and a discharge signal connection line connecting discharge signal lines to each other for the two rows; a common scanning signal line for applying a scanning signal common to the two rows to the scanning signal connection line; and a liquid crystal panel in which the signal-to-signal connection line and the common scanning signal line are wired in an edge portion. The signal-to-signal connection line is wired in common to the two rows, and intersects with (N−1) common scanning signal lines.

In the present invention, each of the pixels arranged in a matrix has at least the first and second subpixels defined to include an electrode pair of the subpixel electrode and the counter electrode facing each other with the liquid crystal layer interposed therebetween, and the scanning signal is applied from the scanning signal line of each row (that is, each line) of the matrix to the control electrodes of the first and second switching elements for applying the data signal to the subpixel electrode included in each of the first and second subpixels. The discharge capacitor electrode is connected to the subpixel electrode of the second subpixel through the third switching element, and the discharge capacitor counter electrode connected to the predetermined potential faces the discharge capacitor electrode. The signal width of the scanning signal is within a range from M times (M is an integer of 0 or more) the length of one horizontal scanning period to (M+1) times, and the discharge signal line for applying the discharge signal to each line is connected to the scanning signal line of a row, which is scanned after N horizontal scanning periods (N is an integer of M+2 or more), by the signal-to-signal connection line.

Therefore, after a point in time at which no data signal is applied to the subpixel electrodes of the first and second subpixels of each line, the discharge signal is applied to the control electrode of the third switching element of the previous line. As a result, for the voltage applied to the liquid crystal layer by the first and second subpixels that the pixel of each line has at least, influences of the rising and falling of the discharge signal of the previous line are canceled out.

In the present invention, the arrangement direction of the first and second subpixels is a direction crossing the discharge signal line, and the discharge signal line is arranged between adjacent first and second subpixels in adjacent pixels.

Therefore, when the scanning signal line is arranged at a position overlapping each pixel, leakage of a signal between the discharge signal line and the scanning signal line is suppressed.

In the present invention, the polarity of the data signal applied to each pixel is inverted every frame. Therefore, the voltage of the subpixel electrode of the second subpixel is effectively changed when the third switching element is turned on, so that the contrast difference between the two subpixels increases.

In the present invention, the signal width of the scanning signal is longer than a length, which is obtained by subtracting a predetermined time from (M+1) times (M is an integer of 0 or more) the length of one horizontal scanning period, and shorter than (M+1) times the length of one horizontal scanning period, and the discharge signal line is connected to the scanning signal line of a row, which is scanned after L horizontal scanning periods (L is an integer of M+3 or more), by the signal-to-signal connection line.

Therefore, since the discharge signal line is connected to the scanning signal line behind L lines, which is scanned after L horizontal scanning periods (L is an integer larger by 1 than the above N), application of the discharge signal to the control electrode of the third switching element of the previous line within a predetermined time from the point in time at which no data signal is applied to the subpixel electrodes of the first and second subpixels of each line is avoided.

In the present invention, an electrode pair defining each of the first and second subpixels of the pixel includes an electrode pair of the auxiliary capacitor electrode and the auxiliary capacitor counter electrode, the auxiliary capacitor electrode is electrically connected to the subpixel electrode, and the auxiliary capacitor counter electrode is connected to the predetermined potential that is the connection destination of the discharge capacitor counter electrode.

Therefore, since the auxiliary capacitor formed by the auxiliary capacitor electrode and the auxiliary capacitor counter electrode is connected in parallel to the liquid crystal capacitor formed by the subpixel electrode and the counter electrode of each of the first and second subpixels, the voltage applied to the liquid crystal layer by the first and second subpixels is stably held for at least one frame period.

In the present invention, when the third switching element is turned on, a part of charges accumulated in the second subpixel move to the first subpixel through the electrode pair having electrodes respectively connected to the discharge capacitor electrode and the subpixel electrode of the first subpixel.

Therefore, the voltages of the subpixel electrodes of the first and second subpixels change in opposite polarities.

In the present invention, at least the scanning signal line and the signal-to-signal connection line are wired in the edge portion of the liquid crystal panel, and the signal-to-signal connection line intersects with (N−1) scanning signal lines at the edge portion of the liquid crystal panel.

That is, the signal-to-signal connection line connects the discharge signal line and the scanning signal line behind N lines, which is scanned after N horizontal scanning periods, to each other in a one-to-one manner. Accordingly, when the signal-to-signal connection line is wired in the edge portion on one side of the liquid crystal panel and the scanning signal is applied to each scanning signal line of each row from the same one side, the signal-to-signal connection line and (N−1) scanning signal lines inevitably intersect with each other at the edge portion on one side of the liquid crystal panel.

In the present invention, data signals that are different alternately for respective lines are applied from two data signal lines, which are arranged for each column of the matrix, to the subpixel electrodes of the first and second subpixels through the first and second switching elements, and the scanning signals of two adjacent lines are simultaneously turned on. Therefore, two lines are scanned within one horizontal scanning period.

In the present invention, the scanning signal line and the signal-to-signal connection line are wired in the edge portion of the liquid crystal panel, and the signal-to-signal connection line intersects with (2N−1) scanning signal lines at the edge portion of the liquid crystal panel.

That is, the signal-to-signal connection line connects the discharge signal line and the scanning signal line behind 2N lines, which is scanned after N horizontal scanning periods, to each other in a one-to-one manner. Accordingly, when the signal-to-signal connection line is wired in the edge portion on one side of the liquid crystal panel and the scanning signal is applied to each scanning signal line from the same one side, the signal-to-signal connection line and (2N−1) scanning signal lines inevitably intersect with each other at the edge portion on one side of the liquid crystal panel.

In the present invention, the scanning signal lines are connected to each other by the scanning signal connection line and the discharge signal lines are connected to each other by the discharge signal connection line for two rows scanned simultaneously, and the common scanning signal line for applying the scanning signal to the scanning signal connection line and the signal-to-signal connection line connecting the discharge signal connection line and the scanning signal connection line to each other are wired in the edge portion of the liquid crystal panel. In addition, the signal-to-signal connection line intersects with (N−1) common scanning signal lines at the edge portion of the liquid crystal panel.

That is, the signal-to-signal connection line connects the discharge signal connection line and the scanning signal connection line, which makes a connection between two lines scanned after N horizontal scanning periods, to each other in a one-to-one manner. Accordingly, when the signalto-signal connection line is wired in the edge portion on one side of the liquid crystal panel and the scanning signal is applied to each common scanning signal line from the same one side, the signal-to-signal connection line and (N−1) common scanning signal lines inevitably intersect with each other at the edge portion on one side of the liquid crystal panel.

According to the present invention, after a point in time at which no data signal is applied to the subpixel electrodes of the first and second subpixels of each line, the discharge signal is applied to the third switching element of the previous line. As a result, for the voltage applied to the liquid crystal layer by the first and second subpixels that the pixel of each line has at least, influences of the rising and falling of the discharge signal of the previous line are canceled out.

Therefore, it is possible to prevent the counter voltage, which is optimal for the counter electrode that the subpixel electrode included in the pixel faces, from deviating from the preset counter voltage.

The above and further objects and features will more fully be apparent from the following detailed description with accompanying drawings.

BRIEF DESCRIPTION OF THE DRAWINGS

FIG. 11 is an explanatory diagram schematically illustrating a configuration for defining a pixel in a liquid crystal panel according to Modification Example 3 of Embodiment 1.

FIG. 16 is an explanatory diagram for describing the presence or absence of horizontal streaks caused by counter voltage deviation.

FIG. 19 is a graph showing the relationship between the connection destination of a discharge signal line and an optimum counter voltage difference.

FIG. 20 is a block diagram illustrating an example of the configuration of a liquid crystal display device according to Modification Example 5 of Embodiment 2.

DETAILED DESCRIPTION

Hereinafter, the present invention will be described in detail with reference to the diagrams illustrating its embodiments.

Embodiment 1

Figure 1:
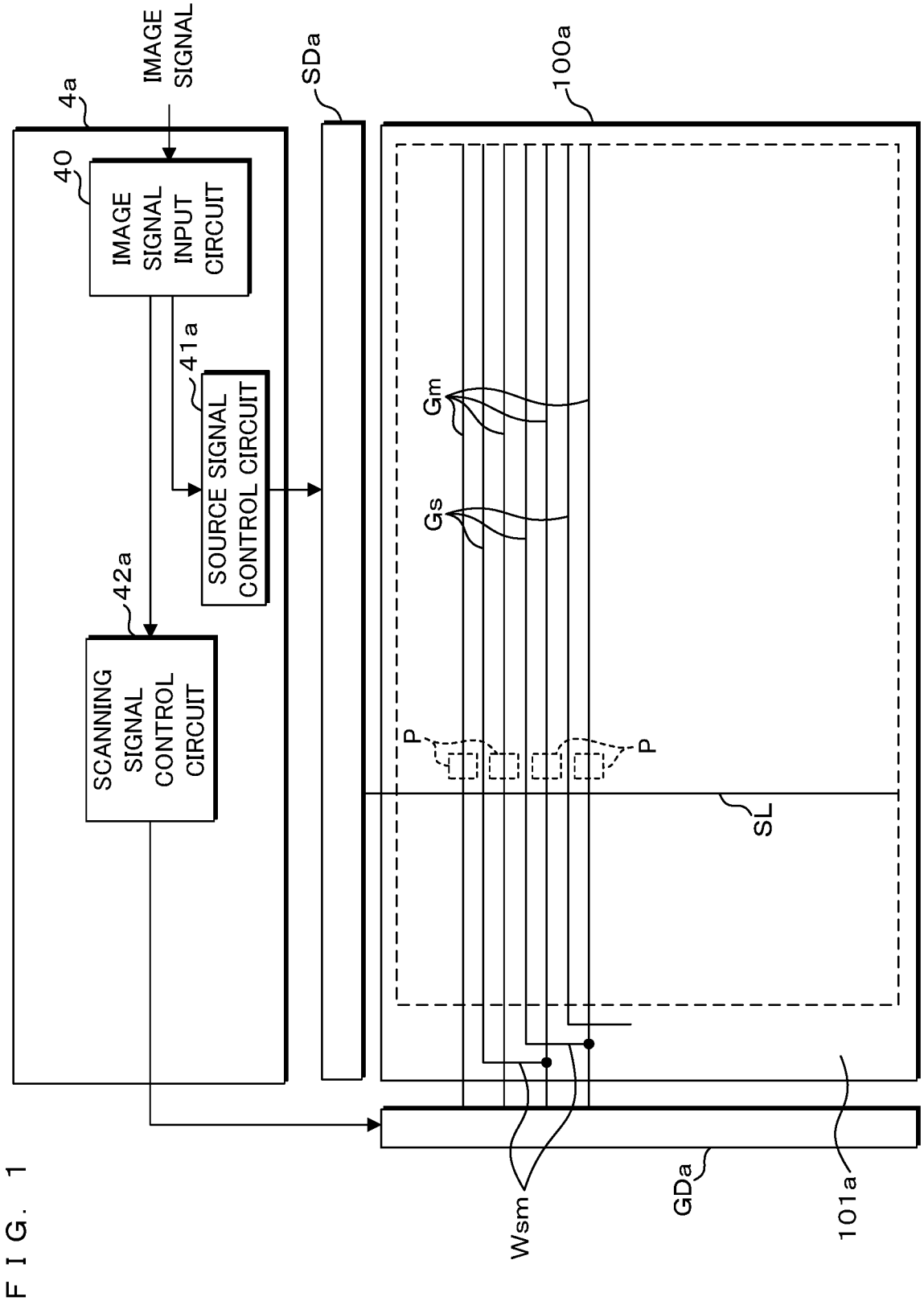
FIG. 1 is a block diagram illustrating an example of the configuration of a liquid crystal display device according to Embodiment 1 of the present invention.
Figure 2:
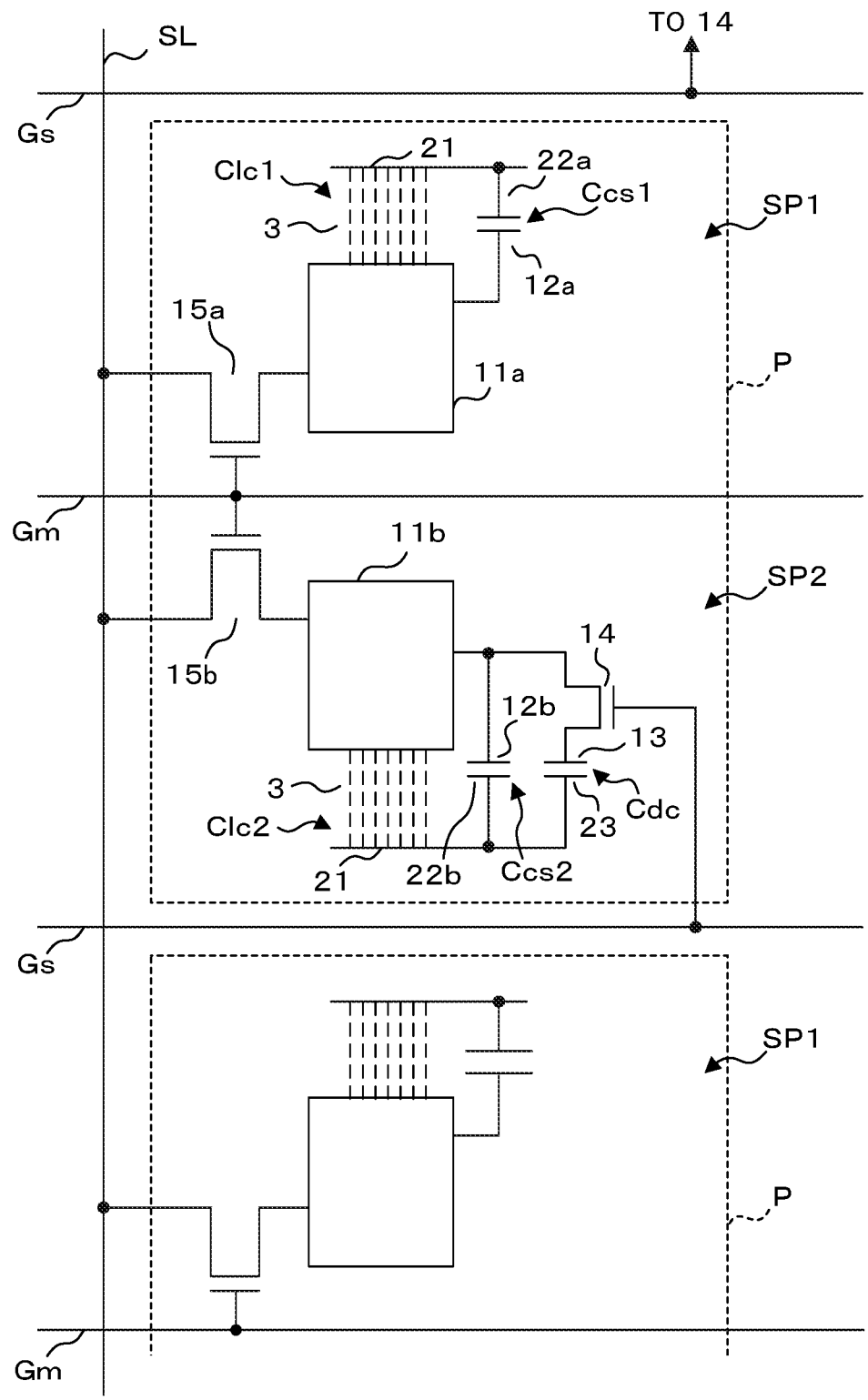
FIG. 2 is an explanatory diagram schematically illustrating a configuration for defining a pixel in the liquid crystal display device according to Embodiment 1.

FIG. 1 is a block diagram illustrating an example of the configuration of a liquid crystal display device according to Embodiment 1 of the present invention, and FIG. 2 is an explanatory diagram schematically illustrating a configuration for defining a pixel P in the liquid crystal display device according to Embodiment 1. The liquid crystal display device illustrated in FIG. 1 includes a liquid crystal panel 100a in which the pixels P, each of which has at least two subpixels defined to include an electrode pair to be described later, are arranged in a matrix in a vertical direction (hereinafter, also referred to as a row direction) and a horizontal direction (hereinafter, also referred to as a column direction) of the display screen. In FIG. 1, four consecutive pixels P in the row direction and signal lines relevant to the pixels P are mainly illustrated. In the following description, it is assumed that a pair of electrodes other than a pair of electrodes facing each other with a liquid crystal layer 3 interposed therebetween face each other with an insulating layer (not illustrated) interposed therebetween to form an electrostatic capacitance (capacitor).

In FIG. 2, the pixel P has at least a subpixel SP1 (corresponding to a first subpixel) and a subpixel SP2 (corresponding to a second subpixel) divided in the vertical direction of the display screen of the liquid crystal panel 100a. The subpixel SP1 is defined to include an electrode pair of a subpixel electrode 11a and a counter electrode 21, which face each other with the liquid crystal layer 3 interposed therebetween, and an electrode pair of an auxiliary capacitor electrode 12a and an auxiliary capacitor counter electrode 22a. A drain electrode of a thin film transistor (TFT: corresponding to a first switching element) 15a is connected to the subpixel electrode 11a. The subpixel electrode 11a and the auxiliary capacitor electrode 12a are electrically connected to each other. The auxiliary capacitor counter electrode 22a is connected to the potential (corresponding to a predetermined potential) of the counter electrode 21. A liquid crystal capacitor Clc1 is formed by the subpixel electrode 11a and the counter electrode 21. In addition, an auxiliary capacitor Ccs1 is formed by the auxiliary capacitor electrode 12a and the auxiliary capacitor counter electrode 22a.

The subpixel SP2 is defined to include an electrode pair of a subpixel electrode 11b and a counter electrode 21 facing each other with the liquid crystal layer 3 interposed therebetween, an electrode pair of an auxiliary capacitor electrode 12b and an auxiliary capacitor counter electrode 22b, and an electrode pair of a discharge capacitor electrode 13 and a discharge capacitor counter electrode 23. A drain electrode of a TFT (corresponding to a second switching element) 15b is connected to the subpixel electrode 11b. The subpixel electrode 11b and the auxiliary capacitor electrode 12b are electrically connected to each other. The discharge capacitor electrode 13 is connected to the subpixel electrode 11b through a TFT (corresponding to a third switching element) 14. The auxiliary capacitor counter electrode 22b and the discharge capacitor counter electrode 23 are connected to the potential of the counter electrode 21. The counter electrode 21 is common to the subpixels SP1 and SP2. However, the present invention is not limited thereto. A liquid crystal capacitor Clc2 is formed by the subpixel electrode 11b and the counter electrode 21. An auxiliary capacitor Ccs2 is formed by the auxiliary capacitor electrode 12b and the auxiliary capacitor counter electrode 22b. In addition, a discharge capacitor Cdc is formed by the discharge capacitor electrode 13 and the discharge capacitor counter electrode 23. In addition, the ratio of the sizes of the subpixel electrode 11a and the subpixel electrode 11b is not limited to 1:1, and the number of subpixels is not limited to two.

On one side of the pixel P in the horizontal direction, a source signal line (corresponding to a data signal line) SL for applying a source signal (corresponding to a data signal) to the subpixel electrodes 11a and 11b through the TFTs 15a and 15b, respectively, is linearly arranged in the vertical direction. Source electrodes of TFTs 15a and 15b are connected to the source signal line SL. Gate electrodes (corresponding to control electrodes) of the TFTs 15a and 15b are connected to a scanning signal line Gm that is linearly arranged so as to horizontally cross the central portion of the pixel P. The gate electrode of the TFT 14 is connected to a discharge signal line Gs that is linearly arranged so as to horizontally cross between the current pixel P and the pixel P in the next row (hereinafter, a row is also referred to as a line) adjacent to the current pixel P in the vertical direction (row direction). The scanning signal line Gm and the discharge signal line Gs are provided row by row in the row direction of the matrix. Since the scanning signal line Gm and the discharge signal line Gs of respective rows are appropriately spaced apart from each other, leakage of a signal between the scanning signal line Gm and the discharge signal line Gs is suppressed.

Returning to FIG. 1, in an edge portion 101a on one side, among edge portions excluding a display region (region surrounded by the broken line in the diagram) where the pixels P are arranged in the liquid crystal panel 100a, signal-to-signal connection lines Wsm connecting each discharge signal line Gs to the scanning signal line Gm behind two lines, which is scanned after two horizontal scanning periods, are separately wired. In the edge portion 101a, the scanning signal line Gm extending from the display region is wired. The signal-to-signal connection line Wsm intersects with one scanning signal line Gm at the edge portion 101a.

In addition, the liquid crystal display device according to Embodiment 1 includes a gate driver GDa for applying a scanning signal to scanning signal lines Gm, Gm, . . . , Gm and applying a discharge signal to discharge signal lines Gs, Gs, . . . , Gs, a source driver SDa for applying a source signal to source signal lines SL, SL, . . . , SL, and a display control circuit 4a for controlling the display of the liquid crystal panel 100a using the gate driver GDa and the source driver SDa.

The display control circuit 4a has an image signal input circuit 40 for receiving an image signal including image data indicating an image and a scanning signal control circuit 42a and a source signal control circuit 41a for controlling the gate driver GDa and the source driver SDa, respectively, based on a clock signal and a synchronization signal separated by the image signal input circuit 40.

The scanning signal control circuit 42a and the source signal control circuit 41a generate control signals such as a start signal, a clock signal, and an enable signal, which are required for the periodic operations of the gate driver GDa and the source driver SDa. In addition, the source signal control circuit 41a outputs digital image data separated by the image signal input circuit 40 to the source driver SDa.

The gate driver GDa sequentially applies scanning signals to the scanning signal lines Gm, Gm, . . . , Gm in one horizontal scanning period within one frame period of the image data. The source driver SDa generates an analog source signal (parallel signal) indicating an image of one line by accumulating the digital image data (serial data) given from the source signal control circuit 41a in one horizontal scanning period (1 H), and applies the generated source signal in parallel to the source signal lines SL, SL, . . . , SL of respective columns. Here, the source signal of one line is updated every horizontal scanning period.

The scanning signal applied to one of the scanning signal lines Gm, Gm, . . . , Gm is applied to the gate electrodes of the TFTs 15a and 15b included in each of the pixels P, P, . . . , P of one line arranged in the column direction. A discharge signal is applied from the discharge signal lines Gs, Gs, . . . , Gs to the gate electrode of the TFT 14 included in each of the pixels P, P, . . . , P of the one line. The discharge signal of each line is delayed by two horizontal scanning periods with respect to the scanning signal of each line.

In one horizontal scanning period in which a scanning signal is applied to one scanning signal line Gm, the source signal applied to the source signal lines SL, SL, . . . , SL is applied to the subpixel electrodes 11a and 11b through the TFTs 15a and 15b, of which gate electrodes are connected to the above one scanning signal line Gm, respectively, and is also applied to the auxiliary capacitor electrodes 12a and 12b. As a result, a source signal is written into the liquid crystal capacitors Clc1 and Clc2 and the auxiliary capacitors Ccs1 and Ccs2 that are formed in the subpixels SP1 and SP2, respectively. In this manner, the source signal of one line is simultaneously written into the pixels P, P, . . . , P of one line in one horizontal scanning period. The source signal written into the subpixels SP1 and SP2 is held for one frame period unless there is a change in the combined capacitance.

Next, the optical configuration of the liquid crystal panel 100a and the optical configuration of another liquid crystal panel that can replace the liquid crystal panel 100a will be described.

Figure 3:
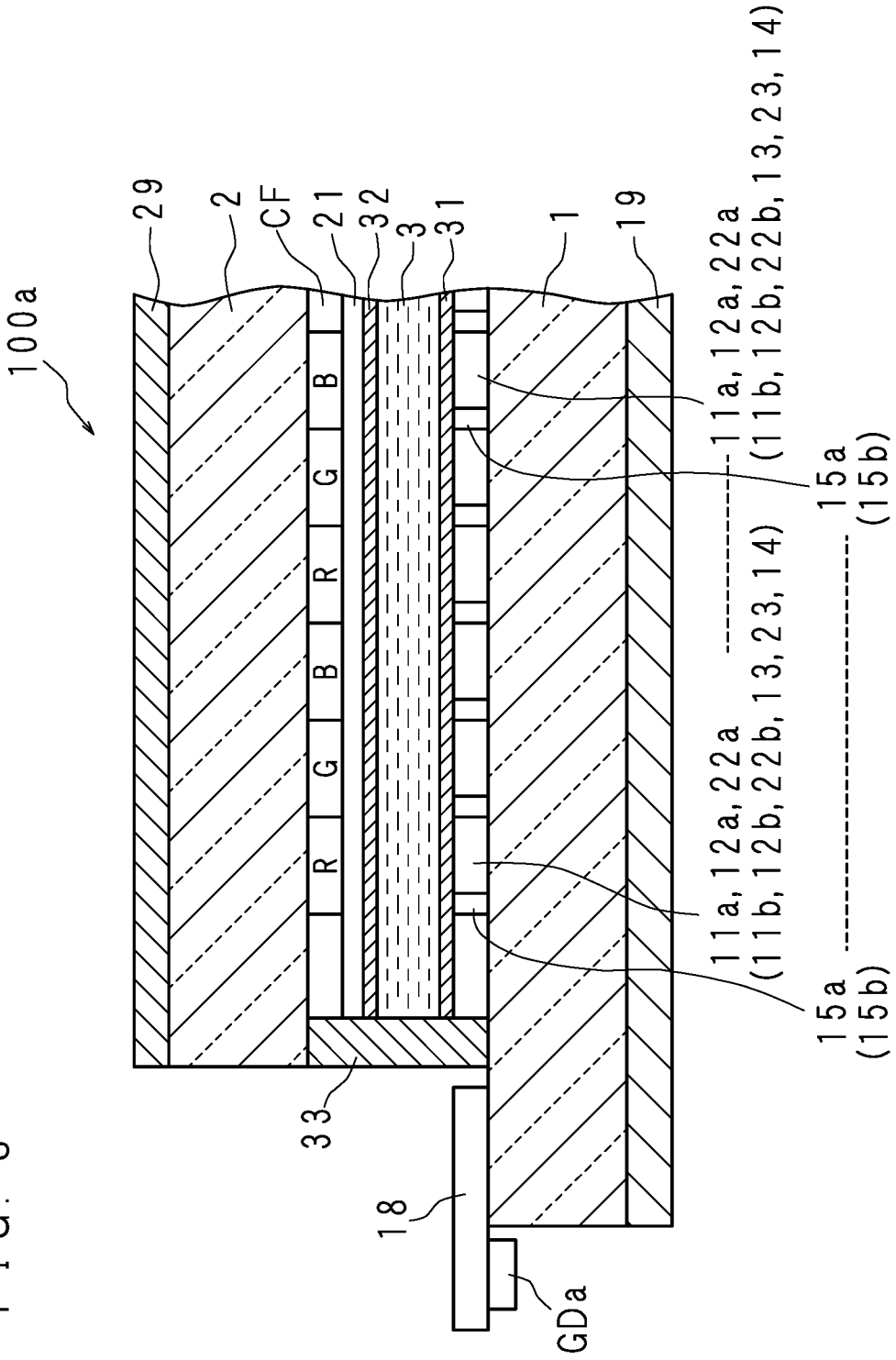
FIG. 3 is a cross-sectional view schematically illustrating the configuration of a liquid crystal panel.

FIG. 3 is a cross-sectional view schematically illustrating the configuration of the liquid crystal panel 100a. The liquid crystal panel 100a is configured by interposing the liquid crystal layer 3 between a first glass substrate (array substrate) 1 and a second glass substrate 2. Between the opposite surfaces of the first glass substrate 1 and the second glass substrate 2, a sealing material 33 for sealing liquid crystal to be sealed in the liquid crystal layer 3 is provided along the peripheral edge portion of the second glass substrate 2.

On one surface of the first glass substrate 1, an alignment film 31 is formed on a layer including the subpixel electrodes 11a and 11b, the auxiliary capacitor electrodes 12a and 12b, the auxiliary capacitor counter electrodes 22a and 22b, the discharge capacitor electrode 13, and the discharge capacitor counter electrode 23, which are transparent electrodes, the TFT 14, and the TFTs 15a and 15b. A polarizing plate 19 is bonded to the other surface of the first glass substrate 1. A flexible substrate 18 on which the gate driver GDa is surface-mounted is attached to one edge portion of the one surface of the first glass substrate 1.

On one surface of the second glass substrate 2, the counter electrode 21 that is a transparent electrode and an alignment film 32 are laminated and formed. In particular, in the liquid crystal panel 100a, a color filter CF is formed between the second glass substrate 2 and the counter electrode 21. A polarizing plate 29 is bonded to the other surface of the second glass substrate 2. In the polarizing plate 19 and the polarizing plate 29, polarization directions (polarization planes) of light beams passing therethrough are different by 90°. A backlight (not illustrated) is provided on the other surface side (side on which the polarizing plate 19 is bonded) of the first glass substrate 1.

In the configuration described above, for example, in the case of a normally black mode, when no voltage is applied between each of the subpixel electrodes 11a and 11b and the counter electrode 21 of the pixel P, the polarization direction of light transmitted through the pixel P does not change. Therefore, light emitted from the backlight and transmitted through the polarizing plate 19 is absorbed by the polarizing plate 29. In contrast, when a voltage is applied between each of the subpixel electrodes 11a and 11b and the counter electrode 21 of the pixel P, the polarization direction of light transmitted through the pixel P changes according to the magnitude of the voltage. Therefore, the light transmitted through the pixel P is transmitted through the polarizing plate 29 in a state in which the polarization direction of light emitted from the backlight and transmitted through the polarizing plate 19 changes according to the magnitude of the voltage. As a result, the brightness of an image displayed by the pixel P changes.

Next, the parasitic capacitance not explicitly illustrated in FIG. 2 will be described.

Figure 4:
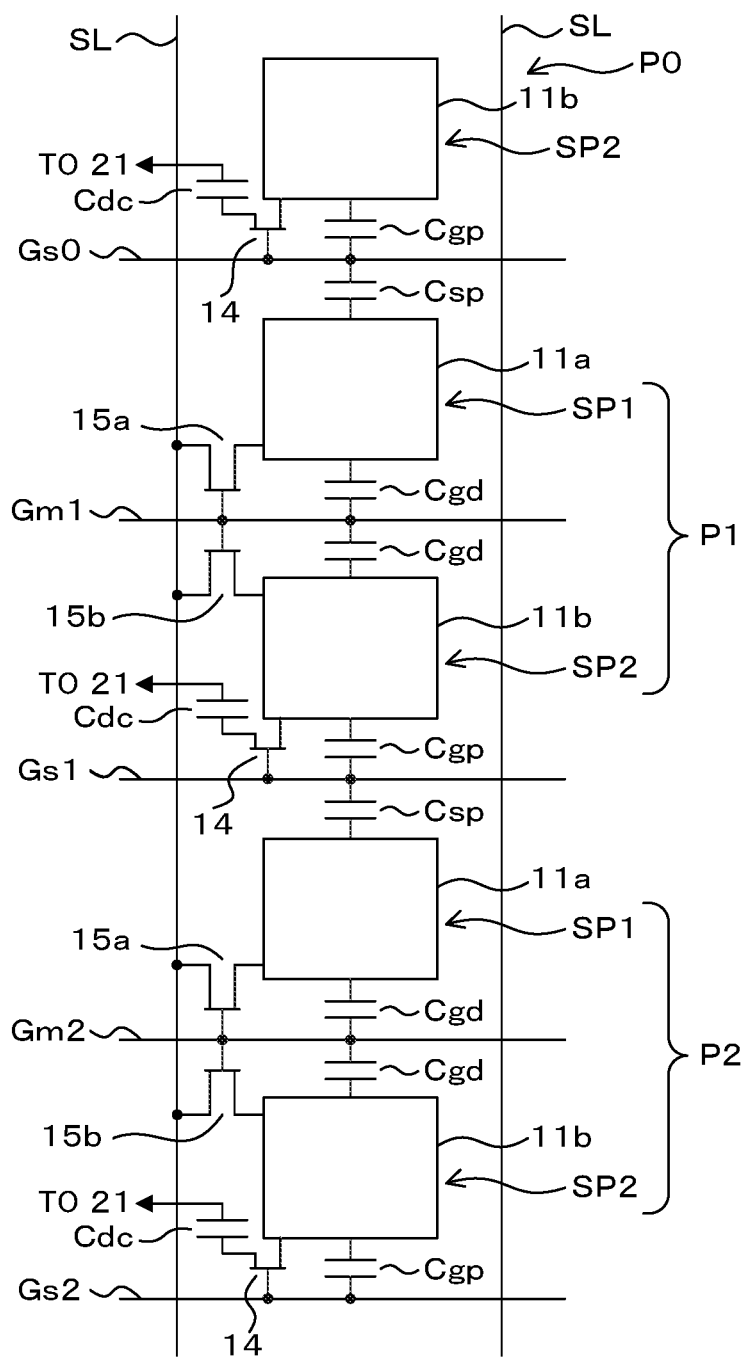
FIG. 4 is an explanatory diagram illustrating a parasitic capacitance associated with a pixel.

FIG. 4 is an explanatory diagram illustrating the parasitic capacitance associated with the pixel P. In FIG. 4, for the following description, the pixel P in the k-th line (k is an integer of 0 or more: the same hereinbelow), the scanning signal line Gm of the k-th line, and the discharge signal line Gs of the k-th line are denoted by Pk, Gmk, and Gsk, respectively. Since the parasitic capacitance is similarly associated with any pixel Pk, description will be given herein without distinction.

In the TFTs 15a and 15b having drain electrodes connected to the subpixel electrodes 11a and 11b of the subpixels SP1 and SP2, a parasitic capacitance is present between the drain and the gate. In addition, a stray capacitance is present between the scanning signal line Gmk connected to the gate electrodes of the TFTs 15a and 15b and each of the subpixel electrodes 11a and 11b. Since the parasitic capacitance and the stray capacitance between the drain and the gate act as parallel capacitances, these capacitances are collectively assumed to be a parasitic capacitance Cgd.

In the TFT 14 having a drain electrode (or a source electrode) connected to the subpixel electrode 11b of the subpixel SP2, a parasitic capacitance is present between the drain and the gate (or between the source and the gate). In addition, a stray capacitance is present between the discharge signal line Gsk connected to the gate electrode of the TFT 14 and the subpixel electrode 11b. Since the parasitic capacitance and the stray capacitance between the drain and the gate (or between the source and the gate) act as parallel capacitances, these capacitances are collectively referred to as a parasitic capacitance Cgp. On the other hand, a stray capacitance is present between the subpixel electrode 11a of the subpixel SP1 and a discharge signal line Gsk−1 (for example, between the subpixel electrode 11a of the subpixel SP1 of the pixel P1 and a discharge signal line Gs0). This is assumed to be a parasitic capacitance Csp.

Next, the influence of each of the parasitic capacitances described above will be described by taking as an example a case where there is a problem.

Figure 5:
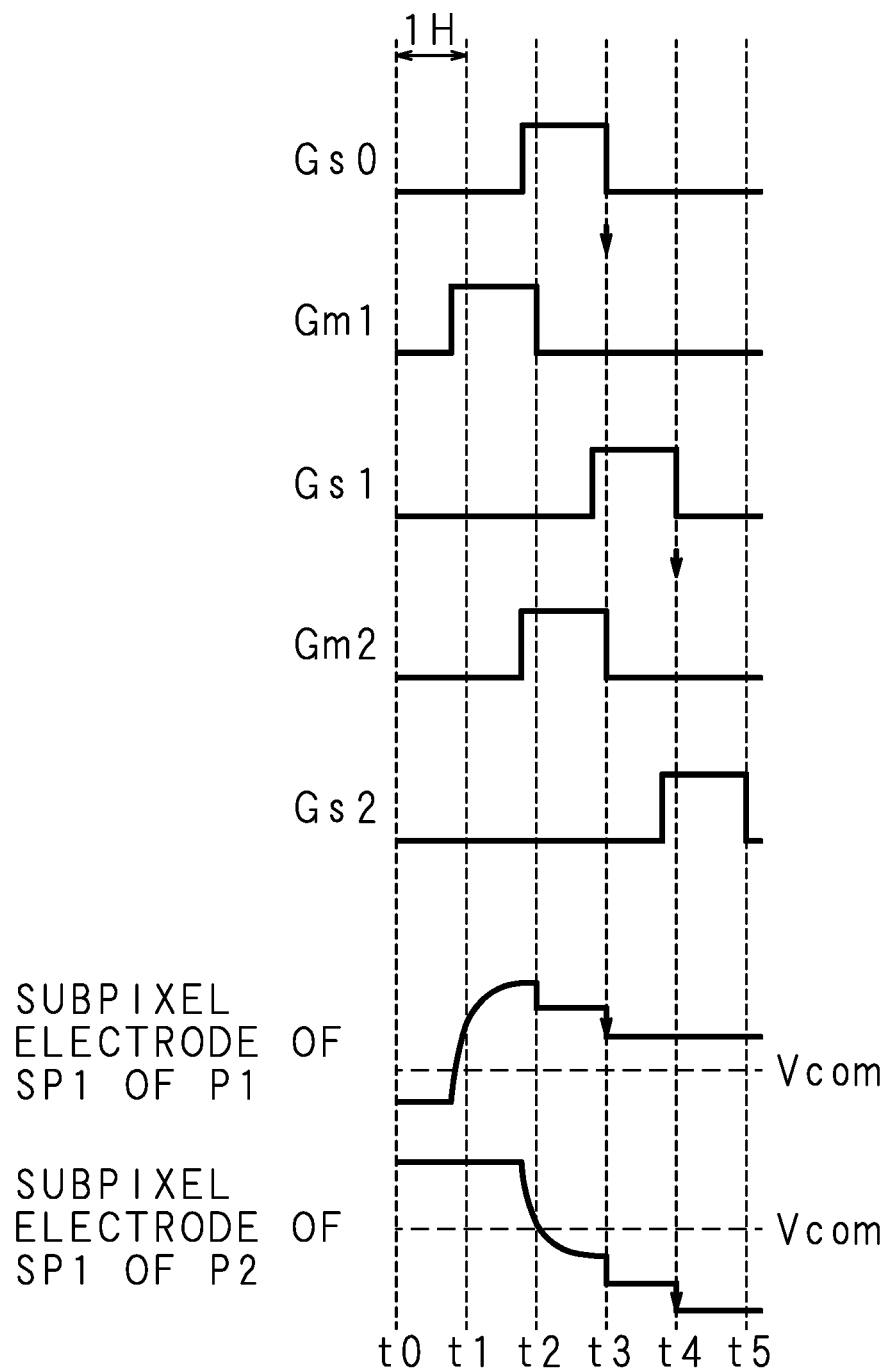
FIG. 5 is a timing chart illustrating temporal changes of a signal applied to each signal line and the voltage of a subpixel electrode.

FIG. 5 is a timing chart illustrating temporal changes of a signal applied to each signal line and the voltage of the subpixel electrode 11a. In seven timing charts illustrated in FIG. 5, all the horizontal axes indicate the same time axis, and the vertical axes indicate, from the top of the diagram, the signal level of the discharge signal line Gs0 of the 0-th line, the signal level of the scanning signal line Gm1 of the first line, the signal level of the discharge signal line Gs1 of the first line, the signal level of the scanning signal line Gm2 of the second line, the signal level of the discharge signal line Gs2 of the second line, the voltage level of the subpixel electrode 11a of the subpixel SP1 of the pixel P1, and the voltage level of the subpixel electrode 11a of the subpixel SP1 of the pixel P2. The signal level is expressed with an ON state as a positive pulse, and the voltage level is expressed as a potential difference with respect to the potential of the counter electrode 21, that is, a counter voltage Vcom. Each period between broken lines is 1 H. The polarity of the data signal written in the pixel Pk is inverted every frame and every line.

The scanning signal from the scanning signal line Gmk is generated so as to have a signal width longer than the length of, for example, 1 H with a delay of 1 H for each line. When the scanning signal from the scanning signal line Gm1 (or Gm2) is turned on during a period from time t0 to t1 (or from t1 to t2), the TFTs 15a and 15b of the pixel P1 (or P2) are turned on (conductive state), and the data signal from the source signal line SL is applied to the subpixel electrodes 11a and 11b and the auxiliary capacitor electrodes 12a and 12b (refer to FIG. 2) of the pixel P1 (or P2). As a result, the voltages of the subpixel electrodes 11a and 11b become the same level as the voltage of the source signal line SL until time t2 (or until t3). This voltage is a voltage applied to the liquid crystal capacitors Clc1 and Clc2. In addition, illustration of the voltage level of the subpixel electrode 11b will be omitted. The voltage waveform of the subpixel electrode 11a of the pixel P1 has a waveform similar to that obtained by inverting the polarity with respect to Vcom after one frame and shifting the voltage waveform of the subpixel electrode 11a of the pixel P2 illustrated in FIG. 5 to the left by 1 H.

Thereafter, when the scanning signal from the scanning signal line Gm1 (or Gm2) is turned on at time t2 (or t3), the TFTs 15a and 15b of the pixel P1 (or P2) is turned off (non-conductive state). At time t2 (or t3), the voltage levels of the subpixel electrodes 11a and 11b slightly drop due to the influence of a so-called pull-in phenomenon (feedthrough) caused by the parasitic capacitance Cgd. In this case, since the absolute values of the voltage levels of the subpixel electrodes 11a and 11b change depending on whether the polarity with respect to Vcom is positive or negative, the average voltage of the voltages applied to the liquid crystal capacitors Clc1 and Clc2 is adjusted to become Vcom after the influence of the pull-in phenomenon. The counter voltage adjusted as described above is referred to as an optimum counter voltage.

Incidentally, it is necessary to prevent the discharge signal from the discharge signal line Gs1 (or Gs2) for turning on the TFT 14 of the pixel P1 (or P2) from overlapping the scanning signal from the scanning signal line Gm1 (or Gm2). Therefore, in FIG. 5, the discharge signal lines Gs0, Gs1, and Gs3 are respectively connected to the scanning signal lines Gm2, Gm3, and Gm4 behind two lines (Gm3 and Gm4 are not illustrated) (refer to FIG. 1), so that the discharge signal is delayed by 2 H from the scanning signal for all lines. When the TFT 14 is turned on by the discharge signal, the discharge capacitor Cdc illustrated in FIG. 2 is connected in parallel to the liquid crystal capacitor Clc2 and the auxiliary capacitor Ccs2.

In this case, since the charge accumulated in the discharge capacitor Cdc is a charge accumulated before one frame, the charge accumulated in the discharge capacitor Cdc has a polarity opposite to the polarity of the charge accumulated in the liquid crystal capacitor Clc2 and the auxiliary capacitor Ccs2. For this reason, during a period from time t3 to t4 (or t4 to t5), a positive charge (or a negative charge) moves from the liquid crystal capacitor Clc2 and the auxiliary capacitor Ccs2 to the discharge capacitor Cdc to reduce the absolute value of the voltage applied to the liquid crystal capacitor Clc2. On the other hand, since the voltage applied to the liquid crystal capacitor Clc1 is not influenced by the turning on of the TFT 14, the absolute value of the voltage applied to the liquid crystal capacitor Clc2 is smaller than the absolute value of the voltage applied to the liquid crystal capacitor Clc1. Therefore, the effect of improving the viewing angle dependence of the gamma characteristics is obtained.

Here, focus is given to the influence of the parasitic capacitance Csp, which is present between the subpixel electrode 11a of the subpixel SP1 of the pixel P1 (or P2) and the discharge signal line Gs0 (or Gs1), on the subpixel electrode 11a of the subpixel SP1 of the pixel P1 (or P2). The discharge signal from the discharge signal line Gs0 rises earlier by 1 H than the rising time of the discharge signal from the discharge signal line Gs1, and falls at time t3. During at least a period from time t1 to t2 (or from t2 to t3) in which the scanning signal from the scanning signal line Gm1 (or Gm2) is ON, the subpixel electrode 11a is connected to the source signal line SL by the TFT 15a and is in a low impedance state. Therefore, it is negligible that the voltage of the subpixel electrode 11a of the pixel P1 (or P2) is influenced by push-up or push-down from the discharge signal line Gs0 (or Gs1) through the parasitic capacitance Csp.

In contrast, after time t2 (or after t3) at which the scanning signal from the scanning signal line Gm1 (or Gm2) is off, the voltage of the subpixel electrode 11a of the pixel P1 (or P2) is held by the liquid crystal capacitor Clc1 and the auxiliary capacitor Ccs1. Accordingly, the voltage tends to fluctuate due to the movement of charge from and to the outside. Specifically, the voltage level of the subpixel electrode 11a of the pixel P1 (or P2) is hardly influenced by the rise at the leading edge of the discharge signal, while the voltage level of the subpixel electrode 11a of the pixel P1 (or P2) is influenced by the trailing edge of the discharge signal and is pushed down at time t3 (or t4).

Since the above-described push-down occurs in the same direction regardless of whether the voltage of the subpixel electrode 11a has a positive or negative polarity, a phenomenon (counter voltage deviation) occurs in which the optimum counter voltage for the subpixel electrode 11a of the subpixel SP1 is shifted in a direction in which the optimum counter voltage becomes lower than the actual counter voltage Vcom. When the counter voltage deviation occurs, a DC voltage is applied to the liquid crystal capacitor Clc1. Accordingly, there is a problem that so-called burn-in or flicker occurs.

In addition, in the example of the timing chart illustrated in FIG. 5, the subpixel electrode 11b of the subpixel SP2 of the pixel P1 (or P2) is almost equally influenced by push-up and push-down from the discharge signal line Gs1 (or Gs2) through the parasitic capacitance Cgp, which is present between the subpixel electrode 11b of the subpixel SP2 of the pixel P1 (or P2) and the discharge signal line Gs1 (or Gs2). Therefore, these influences are canceled out to cause no problem.

In order to avoid the problem occurring in the case of FIG. 5, the discharge signal may be delayed by 3 H or more from the scanning signal for all lines, or the signal widths of the scanning signal and the discharge signal may be made shorter than the length of 1 H so that the discharge signal from the discharge signal line Gs0 (or Gs1) does not overlap the scanning signal from the scanning signal line Gm1 (or Gm2). In general, when the signal widths of the scanning signal and the discharge signal are shorter than the length of 1 H, the discharge signal line Gs of each line may be connected to the scanning signal line Gm behind two lines that is scanned after 2 H. When the signal widths of the scanning signal and the discharge signal are longer than M times (M is an integer of 0 or more) the length of 1 H and shorter than (M+1) times, the discharge signal line Gs of each line may be connected to the scanning signal line Gm behind (M+2) lines or more.

Hereinafter, a specific example in which the problem of the present application is solved will be described.

Figure 6A:
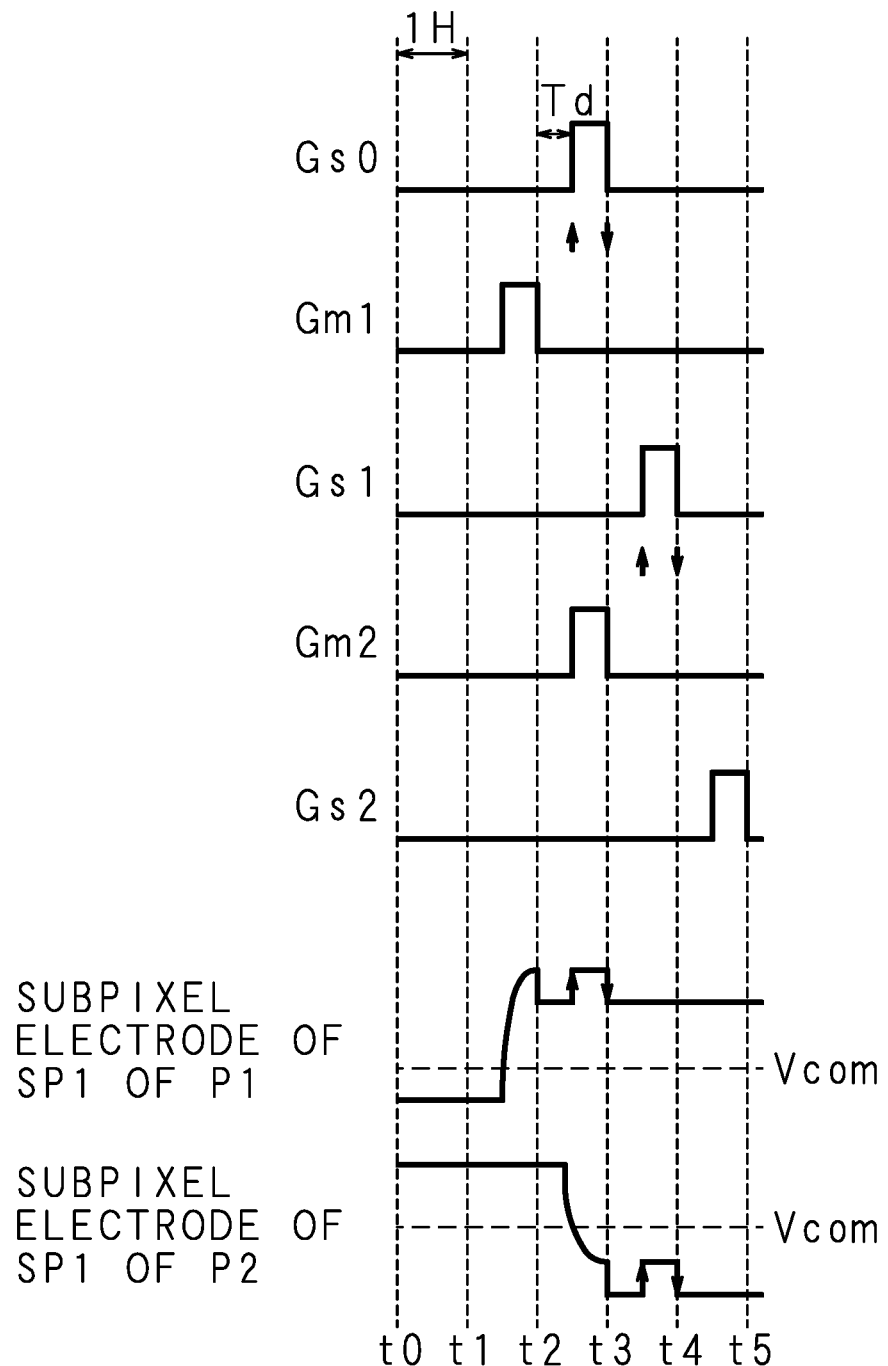
FIG. 6A is a timing chart illustrating temporal changes of a signal applied to each signal line and the voltage of a subpixel electrode in the liquid crystal display device according to Embodiment 1.
Figure 6B:
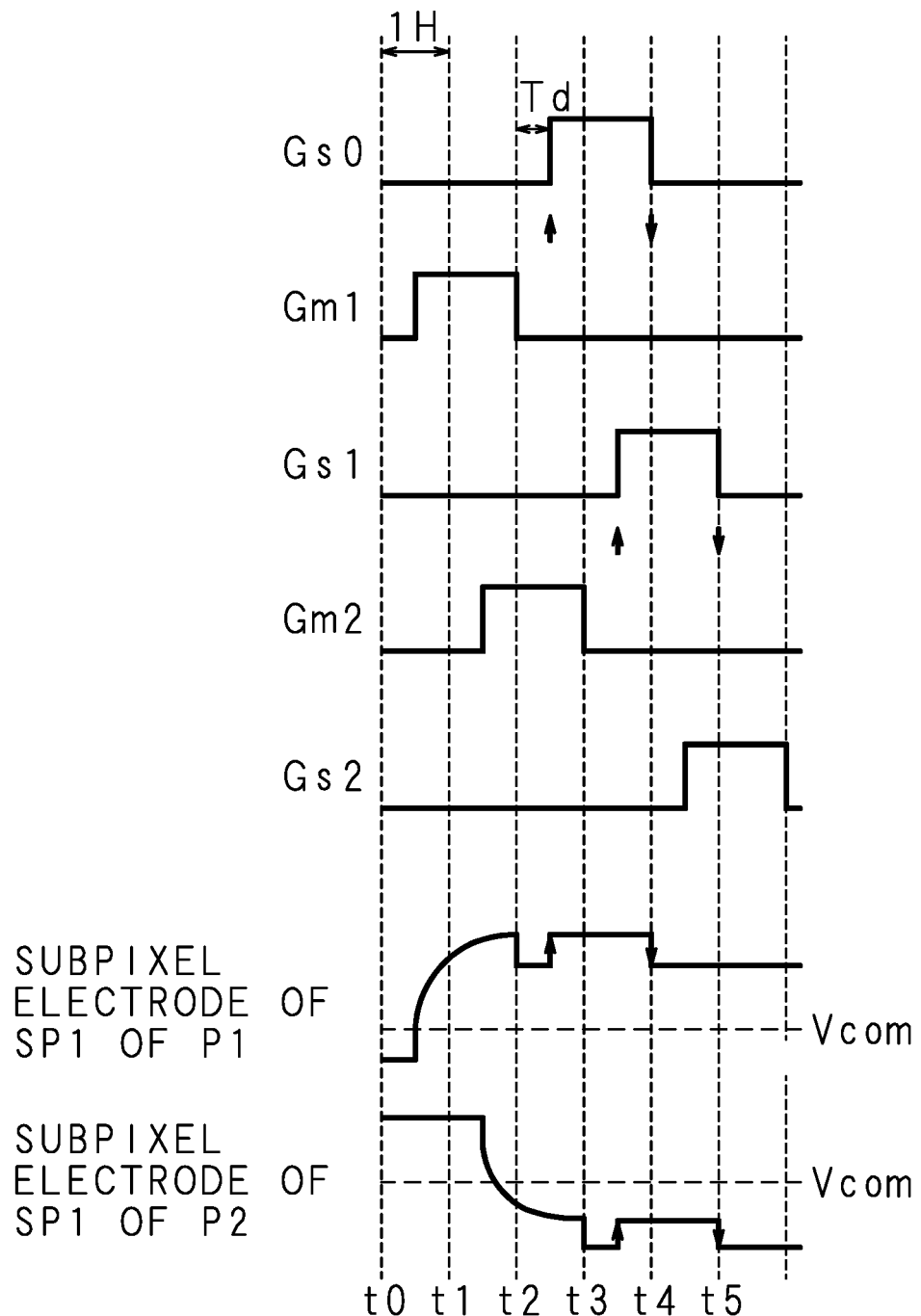
FIG. 6B is a timing chart illustrating temporal changes of a signal applied to each signal line and the voltage of a subpixel electrode in the liquid crystal display device according to Embodiment 1.

FIGS. 6A and 6B are timing charts illustrating temporal changes of a signal applied to each signal line and the voltage of the subpixel electrode 11a in the liquid crystal display device according to Embodiment 1. In seven timing charts illustrated in FIGS. 6A and 6B, all the horizontal axes indicate the same time axis, and the vertical axes indicate, from the top of the diagram, the signal level of the discharge signal line Gs0 of the 0-th line, the signal level of the scanning signal line Gm1 of the first line, the signal level of the discharge signal line Gs1 of the first line, the signal level of the scanning signal line Gm2 of the second line, the signal level of the discharge signal line Gs2 of the second line, the voltage level of the subpixel electrode 11a of the subpixel SP1 of the pixel P1, and the voltage level of the subpixel electrode 11a of the subpixel SP1 of the pixel P2. The signal level is expressed with an ON state as a positive pulse, and the voltage level is expressed as a potential difference with respect to the potential of the counter electrode 21, that is, a counter voltage Vcom. Each period between broken lines is 1 H.

FIG. 6A is different from FIG. 6B in that the signal widths of the scanning signal and the discharge signal are less than the length of 1 H in FIG. 6A while the signal widths of the scanning signal and the discharge signal are longer than the length of 1 H and less than the length of 2 H in FIG. 6B. The point that the scanning signal from the scanning signal line Gmk is delayed by 1 H every line and the point that the leading edge (rising edge in FIGS. 6A and 6B) of the discharge signal from the discharge signal line Gsk−1 is delayed by time (corresponding to a predetermined time) Td or more compared with the trailing edge (falling edge in FIGS. 6A and 6B) of the scanning signal from the scanning signal line Gmk are common in FIGS. 6A and 6B. This is the same for a case where the signal widths of the scanning signal and the discharge signal are longer than the length of 2 H.

In the case of FIG. 6A, the discharge signal lines Gs0, Gs1, and Gs3 are respectively connected to the scanning signal lines Gm2, Gm3, and Gm4 behind two lines, so that the discharge signal is delayed by 2 H from the scanning signal for all lines. In a case where the scanning signal from the scanning signal line Gm1 (or Gm2) rises during a period from time t1 to t2 (or from time t2 to t3) to turn on the TFTs 15a and 15b and then falls at time t2 (or t3), the voltage level of the subpixel electrode 11a slightly decreases due to the influence of the pull-in phenomenon (feed-through). Thereafter, the discharge signal from the discharge signal line Gs0 (or Gs1) rises with a delay of Td or more, and the discharge signal falls at time t3 (or t4). During this period, the voltage level of the subpixel electrode 11a of the pixel P1 (or P2) is almost equally influenced by push-up and push-down due to the rising and falling of the discharge signal from the discharge signal line Gs0 (or Gs1). Therefore, the voltage level of the subpixel electrode 11a of the pixel P1 (or P2) is maintained at almost the same voltage as when there is no influence of these discharge signals.

When the case of FIG. 5 is compared with the case of FIG. 6A, the signal widths of the scanning signal and the discharge signal are shorter than the length of 1 H in the case of FIG. 6A. Therefore, the same effect as when the discharge signal of each line is delayed by 3 H from the scanning signal in the case of FIG. 5 in which these signal widths are longer than the length of 1 H is obtained. As will be described in Embodiment 2 to be described later, it is preferable to secure about 2 μs as the length of Td. However, even if the length of Td is 2 μs or less, the effect of the present invention is not lost.

On the other hand, in the case of FIG. 6B, the discharge signal lines Gs0, Gs1, and Gs3 are respectively connected to the scanning signal lines Gm2, Gm3, and Gm4 behind three lines, so that the discharge signal is delayed by 3 H from the scanning signal for all lines. In a case where the scanning signal from the scanning signal line Gm1 (or Gm2) rises during a period from time t0 to t1 (or from time t1 to t2) to turn on the TFTs 15a and 15b and then falls at time t2 (or t3), the voltage level of the subpixel electrode 11a slightly decreases due to the influence of the pull-in phenomenon (feed-through). Thereafter, the discharge signal from the discharge signal line Gs0 (or Gs1) rises with a delay of Td or more, and the discharge signal falls at time t4 (or t5). During this period, the voltage level of the subpixel electrode 11a of the pixel P1 (or P2) is almost equally influenced by push-up and push-down due to the rising and falling of the discharge signal from the discharge signal line Gs0 (or Gs1). Therefore, the voltage level of the subpixel electrode 11a of the pixel P1 (or P2) is maintained at almost the same voltage as when there is no influence of these discharge signals.

When the case of FIG. 5 is compared with the case of FIG. 6B, the point that the signal widths of the scanning signal and the discharge signal are longer than the length of 1 H and shorter than the length of 2 H is common. However, in the case of FIG. 6B, the delay of the discharge signal with respect to the scanning signal of each line is increased by 1 H as compared with the case of FIG. 5. Therefore, there is an effect of preventing the counter voltage deviation by suppressing the delay of the discharge signal to the minimum.

As described above, according to the present Embodiment 1, each of the pixels P arranged in a matrix has at least the first subpixel SP1 and the second subpixel SP2 defined to include an electrode pair of each of the subpixel electrodes 11a and 11b and the counter electrode 21, which face each other with the liquid crystal layer 3 interposed therebetween, and the scanning signal from the scanning signal line Gm of each row (that is, each line) of the matrix is applied to the gate electrodes of the TFTs 15a and 15b for applying the data signal to the subpixel electrodes 11a and 11b respectively included in the first subpixel SP1 and the second subpixel SP2. The discharge capacitor electrode 13 is connected to the subpixel electrode 11b of the second subpixel SP2 through the TFT 14, and the discharge capacitor counter electrode 23 connected to the potential of the counter electrode 21 faces the discharge capacitor electrode 13. The signal width of the scanning signal is within a range from M times (M is 0 or 1) the length of 1 H to (M+1) times, and the discharge signal line Gs for applying the discharge signal to each line is connected to the scanning signal line Gm behind N lines, which is scanned after N horizontal scanning periods (N is M+2, that is, 2 or 3), by the signal-to-signal connection line Wsm.

Therefore, after a point in time at which no data signal is applied to the subpixel electrodes 11a and 11b of the first subpixel SP1 and the second subpixel SP2 of each line, the discharge signal is applied to the gate electrode of the TFT 14 of the previous line. As a result, for the voltage applied to the liquid crystal layer 3 by the first subpixel SP1 and the second subpixel SP2 that the pixel P of each line has at least, influences of the rising and falling of the discharge signal of the previous line are canceled out.

Therefore, it is possible to prevent the counter voltage, which is optimal for the counter electrode 21 that the subpixel electrodes 11a and 11b defining the pixel P face, from deviating from the preset counter voltage.

In addition, according to Embodiment 1, the arrangement direction of the first subpixel SP1 and the second subpixel SP2 is a direction crossing the discharge signal line Gs, that is, the row direction, the discharge signal line Gs is arranged between the subpixel SP1 and the subpixel SP2 adjacent to each other in the pixels P and P adjacent to each other in the row direction, and the scanning signal line is arranged between the subpixel SP1 and the subpixel SP2 in the pixel P.

Therefore, leakage of a signal between the discharge signal line Gs and the scanning signal line Gm can be suppressed. As a result, the manufacturing yield of the liquid crystal panel 100a is improved. On the other hand, due to the configuration described above, the parasitic capacitance Csp between the discharge signal line Gs and the first subpixel SP1 increases. In such a case, however, there is an effect of preventing the counter voltage deviation.

In addition, according to Embodiment 1, the polarity of the data signal applied to each pixel P is inverted every frame. Therefore, the voltage of the subpixel electrode 11b of the second subpixel SP2 is effectively changed when the TFT 14 is turned on, so that it is possible to increase the contrast difference between the two subpixels.

In addition, according to Embodiment 1, an electrode pair defining each of the first subpixel SP1 and the second subpixel SP2 that the pixel P have includes an electrode pair of the auxiliary capacitor electrode 12a and the auxiliary capacitor counter electrode 22a and an electrode pair of the auxiliary capacitor electrode 12b and the auxiliary capacitor counter electrode 22b. The auxiliary capacitor electrodes 12a and 12b are electrically connected to the subpixel electrodes 11a and 11b, respectively, and each of the auxiliary capacitor counter electrodes 22a and 22b is connected to the potential of the counter electrode 21 that is the connection destination of the discharge capacitor counter electrode 23.

Therefore, since the auxiliary capacitor Ccs1 formed by the auxiliary capacitor electrode 12a and the auxiliary capacitor counter electrode 22a and the auxiliary capacitor Ccs2 formed by the auxiliary capacitor electrode 12b and the auxiliary capacitor counter electrode 22b are respectively connected in parallel to the liquid crystal capacitors Clc1 and Clc2 formed by the subpixel electrodes 11a and 11b and the counter electrode 21 of the first subpixel SP1 and the second subpixel SP2, it is possible to stably hold the voltage applied to the liquid crystal layer 3 by the first subpixel SP1 and the second subpixel SP2 for at least one frame period. Thus, with the configuration in which the optimum counter voltage can be stably set, it is possible to make the effect of preventing the counter voltage deviation to the utmost.

In addition, according to Embodiment 1, the scanning signal line Gm and the signal-to-signal connection line Wsm are wired in the edge portion 101a on one side of the liquid crystal panel 100a, and the signal-to-signal connection line Wsm intersects with the (N−1) (=1) scanning signal lines Gm at the edge portion 101a.

That is, the signal-to-signal connection line Wsm connects the discharge signal line Gs and the scanning signal line Gm behind N lines, which is scanned after N (=2) horizontal scanning periods, to each other in a one-to-one manner, and the scanning signal is applied to each scanning signal line Gm from the edge portion 101a side on which the signal-to-signal connection line Wsm is wired. Accordingly, the signal-to-signal connection line Wsm and the (N−1) scanning signal lines Gm inevitably intersect with each other at the edge portion 101a on one side of the liquid crystal panel 100a.

Modification Example 1

The signal widths of the scanning signal and the discharge signal are set to lengths different from the length of 1 H in Embodiment 1, whereas the signal widths of the scanning signal and the discharge signal are set to the length of approximately 1 H in Modification Example 1 of Embodiment 1. In the present Modification Example 1, when the effect of the present invention is reduced because Td illustrated in FIGS. 6A and 6B of Embodiment 1 is shorter than a predetermined time, an effective solution is presented.

Figure 7:
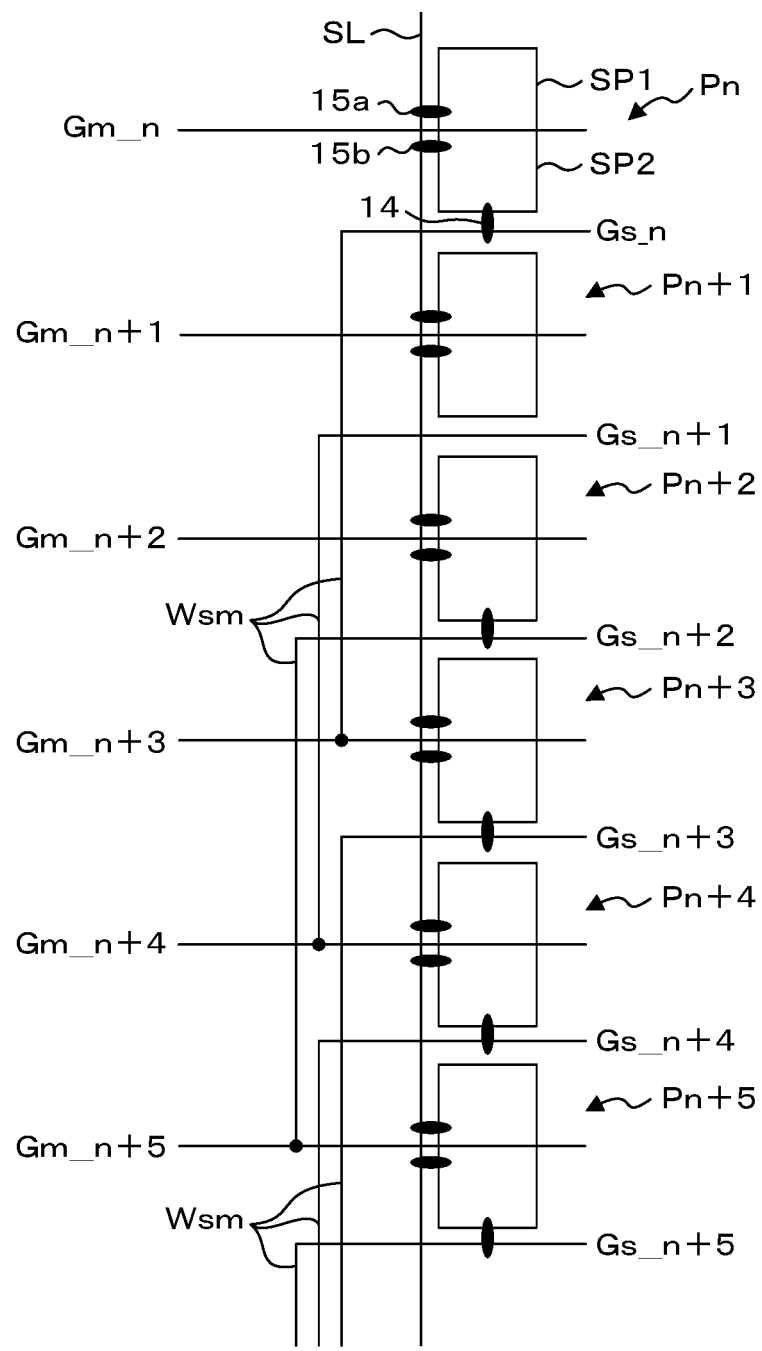
FIG. 7 is an explanatory diagram illustrating a connection example of a signal-to-signal connection line in a liquid crystal panel according to Modification Example 1 of Embodiment 1.
Figure 8:
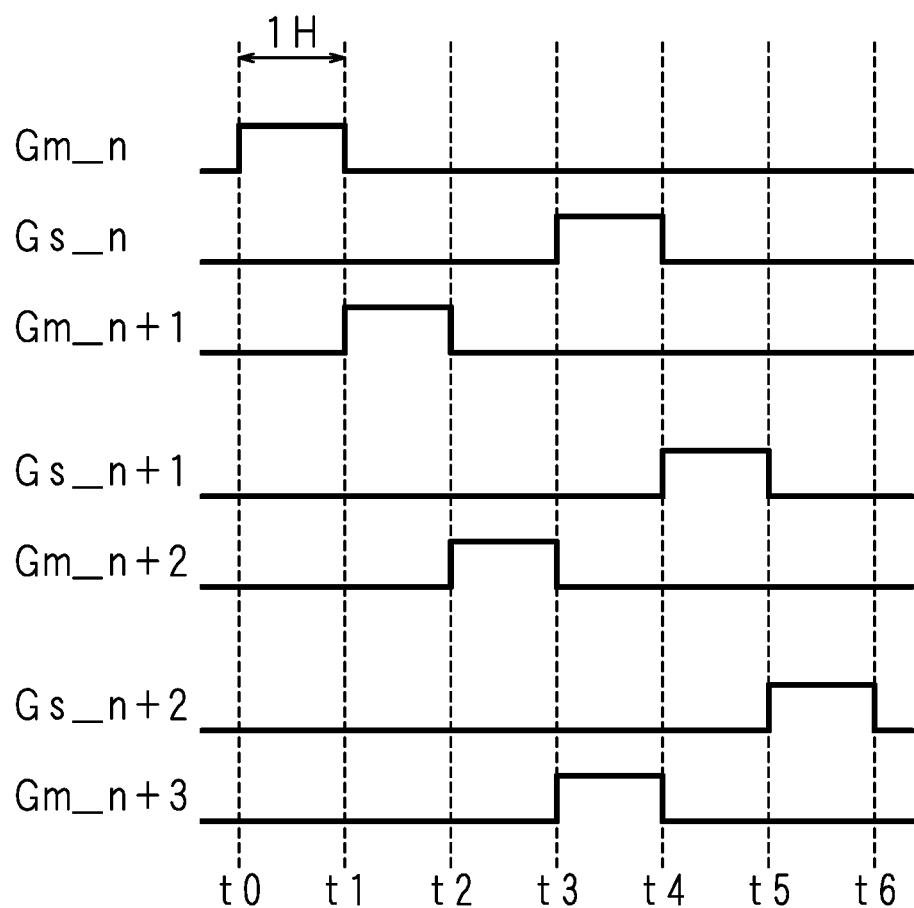
FIG. 8 is a timing chart illustrating temporal changes of a scanning signal and a discharge signal in the liquid crystal panel according to Modification Example 1 of Embodiment 1.

FIG. 7 is an explanatory diagram illustrating a connection example of the signal-to-signal connection line Wsm in the liquid crystal panel according to Modification Example 1 of Embodiment 1, and FIG. 8 is a timing chart illustrating temporal changes of the scanning signal and the discharge signal in the liquid crystal panel according to Modification Example 1 of Embodiment 1. Since the liquid crystal panel in the present Modification Example 1 is different from the liquid crystal panel 100a of Embodiment 1 only in the connection destination of the signal-to-signal connection line Wsm, illustration thereof will be omitted. Hereinafter, the same configurations as in Embodiment 1 are denoted by the same reference numerals and the description thereof will be omitted, and a configuration different from Embodiment 1 will be described.

In FIG. 7, for the sake of explanation, the pixel P of the n-th line (n is a natural number), the scanning signal line Gm of the n-th line, and the discharge signal line Gs of the n-th line are denoted by Pn, Gm_n, and Gs_n, respectively. In addition, the reference numerals of the subpixels SP1 and SP2 and the reference numerals of the TFTs 15a, 15b, and 14 are displayed only for the pixel Pn of the n-th line among the pixels Pn, Pn+1, . . . , Pn+5. The TFTs 15a, 15b, and 14 are expressed by ellipses filled with black for simplicity. The discharge signal lines Gs_n, Gs_n+1, and Gs_n+2 are separately connected to the scanning signal lines Gm_n+3, Gm_n+4, and Gm_n+5 behind three lines, which are scanned after three horizontal scanning periods, by the signal-to-signal connection line Wsm. This is the same for the discharge signal lines Gs_n+3, Gs_n+4, and Gs_n+5 whose connection destinations are not illustrated.

Returning to FIG. 8, in seven timing charts illustrated in the diagram, all the horizontal axes indicate the same time axis, and the vertical axes indicate, from the top of the diagram, the signal levels of the scanning signal line Gm_n and the discharge signal line Gs_n of the n-th line, the signal levels of the scanning signal line Gm_n+1 and the discharge signal line Gs_n+1 of the (n+1)-th line, the signal levels of the scanning signal line Gm_n+2 and the discharge signal line Gs_n+2 of the (n+2)-th line, and the signal level of the scanning signal line Gm_n+3 of the (n+3)-th line. The signal level is expressed with an ON state as a positive pulse. Each period between broken lines is 1 H. The signal widths of the scanning signal and the discharge signal are each approximately 1 H in length. The scanning signal is generated so as to be delayed by 1 H every line.

Due to the connection illustrated in FIG. 7, in FIG. 8, the discharge signal is delayed by 3 H from the scanning signal for all lines. In a case where the scanning signal from the scanning signal line Gm_n+1 (or Gm_n+2 or Gm_n+3) rises at time t1 (or time t2 or t3) to turn on the TFTs 15a and 15b and then falls at time t2 (or t3 or t4), the voltage level of the subpixel electrode 11a slightly decreases due to the influence of the pull-in phenomenon (feed-through).

Thereafter, the discharge signal from the discharge signal line Gs_n (or Gs_n+1 or Gs_n+2) rises with a delay of 1 H, and the discharge signal falls at time t4 (or t5 or t6). During this period, for example, the voltage level of the subpixel electrode 11a of the pixel Pn+1 (or Pn+2 or Pn+3) is almost equally influenced by push-up and push-down due to the rising and falling of the discharge signal from the discharge signal line Gs_n (or Gs_n+1 or Gs_n+2). Therefore, since the voltage level of the subpixel electrode 11a of the pixel Pn+1 (or Pn+2 or Pn+3) is maintained at almost the same voltage as when there is no influence of these discharge signals, the counter voltage deviation is prevented.

In general, when the signal widths of the scanning signal and the discharge signal are longer than a length, which is obtained by subtracting a predetermined time (for example, 2 μs described above) from the length of 1 H, and shorter than the length of 1 H, the discharge signal line Gs of each line may be connected to the scanning signal line Gm behind three lines that is scanned after 3 H. When the signal widths of the scanning signal and the discharge signal are longer than a length, which is obtained by subtracting a predetermined time from (M+1) times (M is an integer of 0 or more) the length of 1 H, and shorter than (M+1) times the length of 1 H, the discharge signal line Gs of each line may be connected to the scanning signal line Gm behind (M+3) lines or more.

In addition, the configuration of the present Modification Example 1 is different from the configuration of Embodiment 1 in that the configuration of the present Modification Example 1 can be applied to other Modification Examples and other embodiments to be described later.

As described above, according to the present Modification Example 1, the signal widths of the scanning signal and the discharge signal are longer than a length, which is obtained by subtracting a predetermined time Td from (M+1) times (M is an integer of 0 or more) the length of 1 H, and shorter than (M+1) times the length of 1 H, and the discharge signal line Gs is connected to the scanning signal line Gm of a row, which is scanned after L horizontal scanning periods (L is M+3 or more, that is, 3 or more), by the signal-to-signal connection line Wsm.

Therefore, since the discharge signal line Gs is connected to the scanning signal line Gm behind L lines, which is scanned after L horizontal scanning periods (L is an integer larger by 1 than the above N), it is possible to avoid the application of the discharge signal to the gate electrode of the TFT 14 of the previous line within a predetermined time from the point in time at which no data signal is applied to the subpixel electrodes 11a and 11b of the first subpixel SP1 and the second subpixel SP2 of each line. As a result, the counter voltage deviation is prevented.

Modification Example 2

The auxiliary capacitor counter electrodes 22a and 22b and the discharge capacitor counter electrode 23 are connected to the potential of the counter electrode 21 in Embodiment 1, whereas the auxiliary capacitor counter electrodes 22a and 22b and the discharge capacitor counter electrode 23 are connected to a predetermined potential different from the potential of the counter electrode 21 in Modification Example 2 of Embodiment 1.

Figure 9:
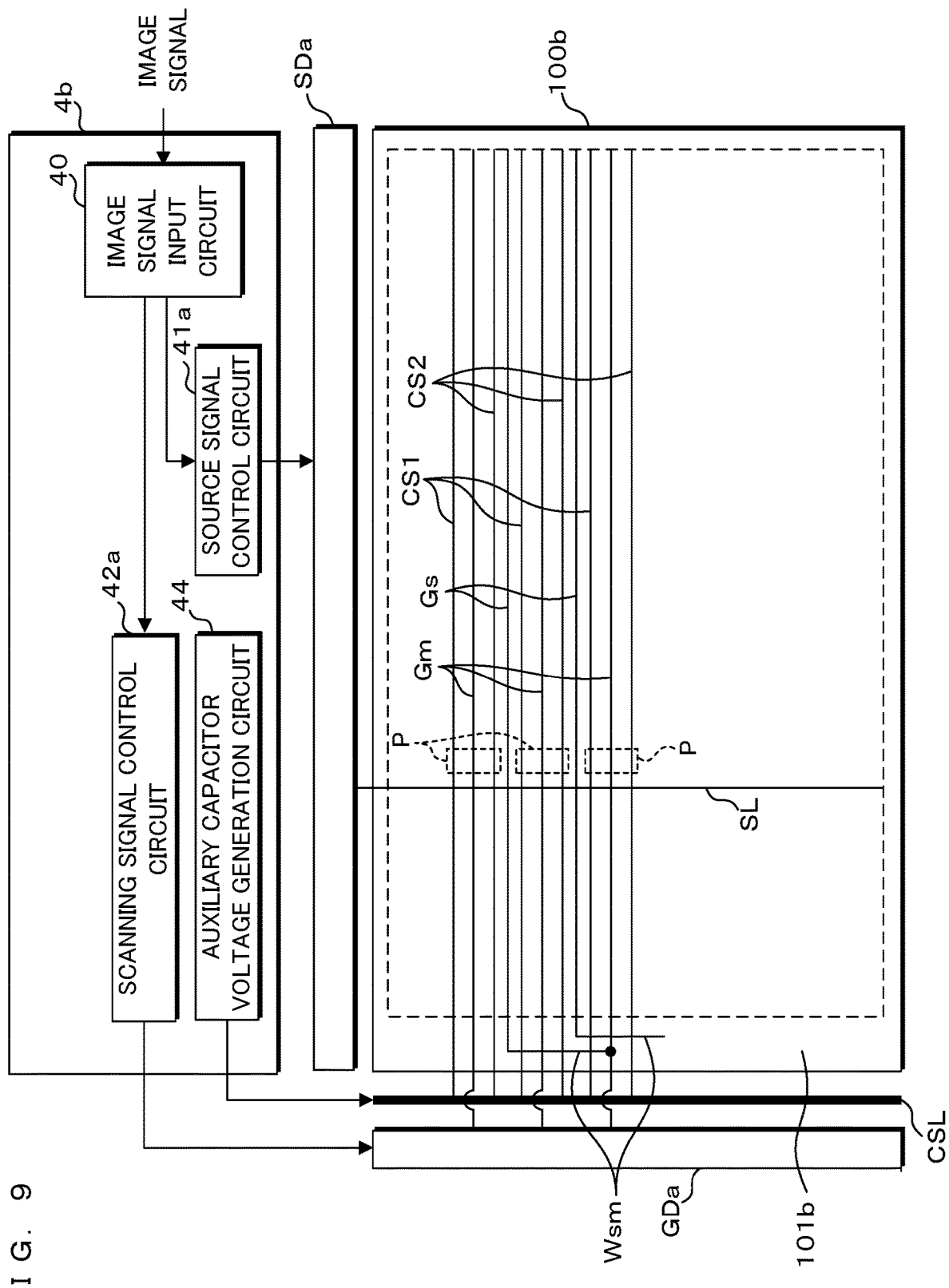
FIG. 9 is a block diagram illustrating an example of the configuration of a liquid crystal display device according to Modification Example 2 of Embodiment 1.
Figure 10:
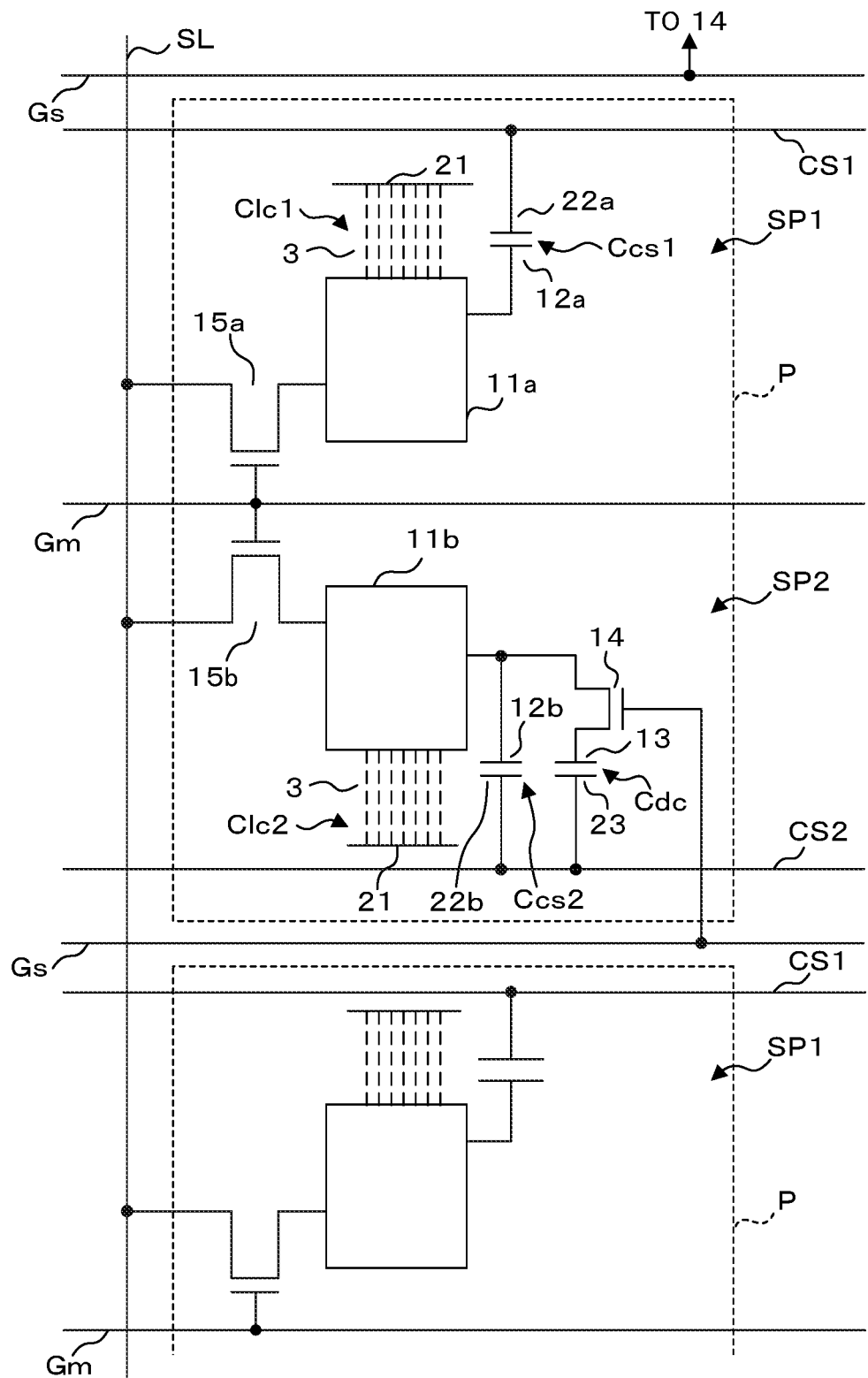
FIG. 10 is an explanatory diagram schematically illustrating a configuration for defining a pixel in a liquid crystal panel according to Modification Example 2 of Embodiment 1.

FIG. 9 is a block diagram illustrating an example of the configuration of a liquid crystal display device according to Modification Example 2 of Embodiment 1, and FIG. 10 is an explanatory diagram schematically illustrating a configuration for defining the pixel P in the liquid crystal display device according to Modification Example 2 of Embodiment 1. The liquid crystal display device according to the present Modification Example 2 includes a liquid crystal panel 100b, a gate driver GDa, a source driver SDa, a display control circuit 4b for controlling the display of the liquid crystal panel 100b using the gate driver GDa and the source driver SDa, and an auxiliary capacitor voltage main wiring CSL for relaying a voltage applied from the display control circuit 4b to the liquid crystal panel 100b. Hereinafter, the same configurations as in Embodiment 1 are denoted by the same reference numerals and the description thereof will be omitted, and a configuration different from Embodiment 1 will be described.

Compared with the liquid crystal panel 100a of Embodiment 1, the liquid crystal panel 100b further includes auxiliary capacitor voltage lines CS1 and CS2 arranged so as to linearly cross both end portions of the pixel P, which are located in the vertical direction, in the horizontal direction. Each of the auxiliary capacitor voltage lines CS1 and CS2 is connected to the auxiliary capacitor voltage main wiring CSL outside the liquid crystal panel 100b, and is connected to the auxiliary capacitor counter electrodes 22a and 22b inside the liquid crystal panel 100b (refer to FIG. 10). The auxiliary capacitor voltage line CS2 is further connected to the discharge capacitor counter electrode 23. Although the auxiliary capacitor voltage line CS2 is connected to the auxiliary capacitor voltage main wiring CSL outside the liquid crystal panel 100b in the present Modification Example 2, the auxiliary capacitor voltage main wiring CSL may be arranged inside the liquid crystal panel 100b.

In an edge portion 101b on one side of the liquid crystal panel 100b, the signal-to-signal connection line Wsm that connects each discharge signal line Gs and the scanning signal line Gm behind two lines, which is scanned after two horizontal scanning periods, to each other is separately wired. In addition, the scanning signal line Gm and the auxiliary capacitor voltage lines CS1 and CS2 extending from the display region are wired in the edge portion 101b. The signal-to-signal connection line Wsm intersects with one scanning signal line Gm at the edge portion 101b in the same manner as in the case of Embodiment 1.

Compared with the display control circuit 4a in Embodiment 1, the display control circuit 4b further includes an auxiliary capacitor voltage generation circuit 44 for generating a predetermined voltage to be applied to the auxiliary capacitor voltage lines CS1 and CS2 through the auxiliary capacitor voltage main wiring CSL. The voltages applied to the auxiliary capacitor voltage lines CS1 and CS2 may be the same or different.

The liquid crystal panel 100a and the liquid crystal panel 100b are different according to whether the connection destination of each of the auxiliary capacitor counter electrodes 22a and 22b and the discharge capacitor counter electrode 23 is the potential of the counter electrode 21 or the potential of the auxiliary capacitor voltage lines CS1 and CS2. However, it is obvious that there is no difference for the effect that the auxiliary capacitors Ccs1 and Ccs2 are respectively connected in parallel to the liquid crystal capacitors Clc1 and Clc2 to store charges and the amount of positive charges (or negative charges) that move from the liquid crystal capacitor Clc2 and the auxiliary capacitor Ccs2 to the discharge capacitor Cdc when the TFT 14 is turned on. From this fact, according to the present Modification Example 2, it can be said that completely the same effect as in Embodiment 1 is obtained.

In addition, the difference between the configuration of Embodiment 1 and the configuration of the present Modification Example 2 can be applied to Modification Example 1 described above and Modification Example 3 and other embodiments to be described later.

Modification Example 3

The absolute value of the effective voltage that is applied to the liquid crystal capacitor Clc1 when the TFT 14 is turned on does not change in Embodiment 1, whereas the absolute value of the effective voltage that is applied to the liquid crystal capacitor Clc1 when the TFT 14 is turned on changes in Modification Example 3 of Embodiment 1.

FIG. 11 is an explanatory diagram schematically illustrating a configuration for defining the pixel P in a liquid crystal panel according to Modification Example 3 of Embodiment 1.

In the present Modification Example 3, a second discharge capacitor (capacitor) Cdc2 formed by an electrode pair having electrodes respectively connected to the discharge capacitor electrode 13 and the auxiliary capacitor electrode 12*a* is connected to the configuration of the pixel P in Embodiment 1. The difference between the liquid crystal panel in the present Modification Example 3 and the liquid crystal panel 100*a* in Embodiment 1 is only the presence or absence of the discharge capacitor Cdc2. In addition, portions corresponding to Embodiment 1 are denoted by the same reference numerals, and the description thereof will be omitted.

Hereinafter, a change in a voltage that is applied to the subpixel electrodes 11*a* and 11*b* when the TFT 14 is turned on will be described.

In the description of Embodiment 1, when the TFT 14 is turned on, a positive charge (or a negative charge) moves from the liquid crystal capacitor Clc2 and the auxiliary capacitor Ccs2 to the discharge capacitor Cdc and the absolute value of the voltage applied to the liquid crystal capacitor Clc2 is reduced while the absolute value of the voltage applied to the liquid crystal capacitor Clc1 does not change. In addition, the voltage of the discharge capacitor electrode 13 immediately before the TFT 14 is turned on is the voltage of the subpixel electrode 11*b* before one frame. On the other hand, in the present Modification Example 3, due to the presence of the second discharge capacitor Cdc2, the voltage of the discharge capacitor electrode 13 immediately before the TFT 14 is turned on is different from the voltage of the subpixel electrode 11*b* before one frame. For this reason, when the TFT 14 is turned on, there is a difference that the absolute value of the voltage applied to the liquid crystal capacitor Clc1 also changes.

In order to describe this specifically, the electrostatic capacitances of the liquid crystal capacitors Clc1 and Clc2, the auxiliary capacitors Ccs1 and Ccs2, and the discharge capacitor Cdc and the second discharge capacitor Cdc2 are denoted by CLC, CCS, and CDC, and CDC2, respectively. Referring to the timing chart illustrated in FIG. 6A, the voltages of the subpixel electrodes 11*a* and 11*b* of the pixel P1 at time t1 before the TFTs 15*a* and 15*b* are turned on by the scanning signal from the scanning signal line Gm1 and the data signal is applied are denoted by V1 and V2, respectively. In addition, the voltage of each of the subpixel electrodes 11*a* and 11*b* of the pixel P1 at time t2 when the data signal is applied is denoted by V3. The polarity of the voltage V3 is opposite to the polarities of the voltages V1 and V2. The voltage of the discharge capacitor electrode 13 at time t1 is maintained at the same voltage V2 as the voltage of the subpixel electrode 11*b* from when the TFT 14 is turned on/off before one frame.

Due to the application of the data signal to the subpixel electrode 11*a* of the pixel P1, the voltage of the subpixel electrode 11*a* rises (or drops) from V1 to V3. This change in voltage V3-V1 is divided by the series circuit of the second discharge capacitor Cdc2 and the discharge capacitor Cdc and is added to the voltage of the discharge capacitor electrode 13. Accordingly, the voltage Vdc of the discharge capacitor electrode 13 at time t2 is expressed by the following Equation (1).

$$Vdc = V2 + (V3 - V1) \times CDC2/(CDC + CDC2) \quad (1)$$

On the right side of Equation (1), the polarities of V2 of the first term and (V3−V1) of the second term are opposite. In order for a positive charge (or a negative charge) to move from the liquid crystal capacitor Clc2 and the auxiliary capacitor Ccs2 to the discharge capacitor Cdc side when the TFT 14 is turned on later, it is preferable that the polarity of Vdc is opposite to the polarity of V3 (that is, the polarity of Vdc is the same as the polarity of V2). The magnitude of CDC2/(CDC+CDC2) is appropriately reduced so that such a polarity relationship is satisfied. In addition, the voltage Vdc is a voltage of a parallel circuit formed by connecting a series circuit, which is formed by connecting the second discharge capacitor Cdc2 in series to a circuit in which the liquid crystal capacitor Clc1 and the auxiliary capacitor Ccs1 are connected in parallel to each other, in parallel to the discharge capacitor Cdc.

Then, it is assumed that, when the TFT 14 is turned on by the discharge signal from the discharge signal line Gs1 during a period from time t3 to t4, a positive charge (or a negative charge) moves from the liquid crystal capacitor Clc2 and the auxiliary capacitor Ccs2 to the above-described parallel circuit and Vdc rises (or drops) by ΔV. In this case, since ΔV is divided by the above-described series circuit and added to the voltage (that is, the voltage of the subpixel electrode 11*b* of the pixel P1) V3 of the liquid crystal capacitor Clc1 and the auxiliary capacitor Ccs1, a voltage V4 of the subpixel electrode 11*a* at time t4 rises (or drops) from the voltage V3 as expressed by the following Equation (2).

$$V4 = V3 + \Delta V \times CDC2/(CLC + CCS + CDC2) \quad (2)$$

On the other hand, since the voltage of the subpixel electrode 11*b* after a positive charge (or a negative charge) moves from the liquid crystal capacitor Clc2 and the auxiliary capacitor Ccs2 to the above-described parallel circuit surely drops (or rises), voltage changes occurring in the subpixel electrodes 11*a* and 11*b* due to the turning on of the TFT 14 become different to cause opposite polarities. As a result, since the absolute value of the voltage applied to the liquid crystal capacitor Clc2 is smaller than the absolute value of the voltage applied to the liquid crystal capacitor Clc1, the effect of improving the viewing angle dependence of the gamma characteristics is obtained.

In addition, the timings showing the temporal changes of a signal applied to each signal line and the voltage of the subpixel electrode 11*a* in the present Modification Example 3 are the same as those illustrated in FIGS. 6A and 6B of Embodiment 1.

In addition, the difference between the configuration of Embodiment 1 and the configuration of the present Modification Example 3 can be applied to Modification Example 1 and Modification Example 2 described above and other embodiments to be described later.

As described above, according to the present Modification Example 3, when the TFT 14 is turned on, a part of charges accumulated in the second subpixel SP2 move to the first subpixel SP1 through the second discharge capacitor Cdc2 formed by an electrode pair having electrodes respectively connected to the discharge capacitor electrode 13 and the subpixel electrode 11*a* of the first subpixel SP1.

Therefore, it is possible to change the voltages of the subpixel electrode 11*a* of the first subpixel SP1 and the subpixel electrode 11*b* of the second subpixel SP2 so as to have opposite polarities. As described above, even in the configuration in which the voltages of the subpixel electrodes 11a and 11b are changed so as to have opposite polarities when the discharge signal is turned on, the effect of preventing the counter voltage deviation is not adversely affected.

Embodiment 2

The same data signal for each line is applied from the source signal line SL, which is arranged for each column of the matrix, to the subpixel electrodes 11a and 11b through the TFTs 15a and 15b in Embodiment 1, whereas data signals that are different alternately for respective lines are applied from two source signal lines SL1 and SL2, which are arranged for each column of the matrix, to the subpixel electrodes 11a and 11b through the TFTs 15a and 15b in Embodiment 2.

Figure 12:
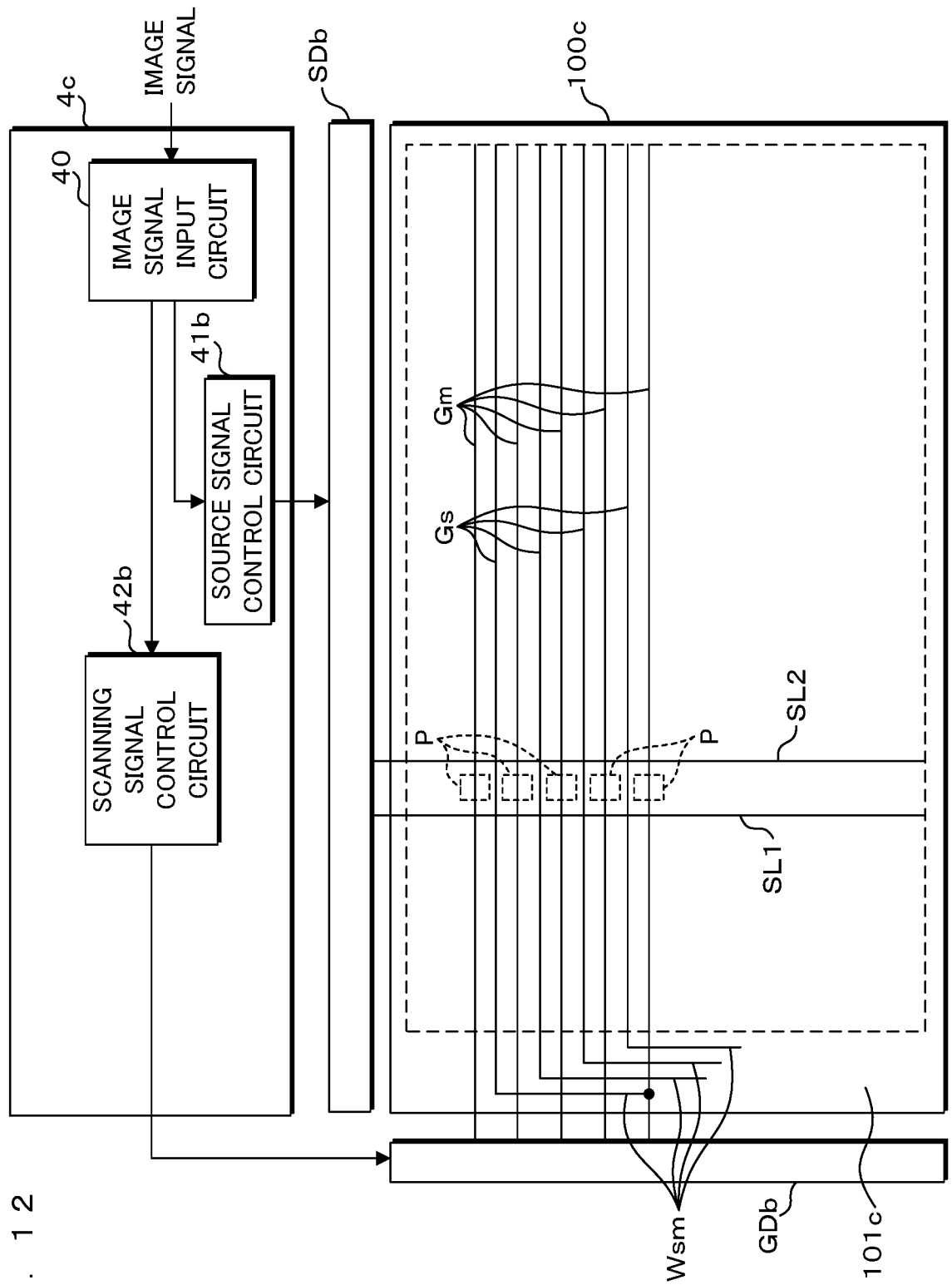
FIG. 12 is a block diagram illustrating an example of the configuration of a liquid crystal display device according to Embodiment 2 of the present invention.

FIG. 12 is a block diagram illustrating an example of the configuration of a liquid crystal display device according to Embodiment 2 of the present invention. The liquid crystal display device according to the present Embodiment 2 includes a liquid crystal panel 100c, a gate driver GDb, a source driver SDb, and a display control circuit 4c for controlling the display of the liquid crystal panel 100c using the gate driver GDb and the source driver SDb. Hereinafter, the same configurations as in Embodiment 1 are denoted by the same reference numerals and the majority of the description thereof will be omitted, and a configuration different from Embodiment 1 will be mainly described.

Compared with the liquid crystal panel 100a of Embodiment 1, the liquid crystal panel 100c further includes the source signal line SL1 arranged in the vertical direction on one side of the pixel P and the source signal line SL2 arranged in the vertical direction on the other side of the pixel P. In an edge portion 101c on one side of the liquid crystal panel 100c, the signal-to-signal connection line Wsm that connects each discharge signal line Gs and the scanning signal line Gm behind four lines, which is scanned after two horizontal scanning periods, to each other is separately wired. The signal-to-signal connection line Wsm intersects with three scanning signal lines Gm at the edge portion 101c.

The display control circuit 4c is different from the display control circuit 4a in Embodiment 1 in that a source signal control circuit 41b controls the two source signal lines SL1 and SL2 for each column of the matrix using the source driver SDb and a scanning signal control circuit 42b simultaneously controls the scanning signal lines Gm and Gm of two adjacent rows using the gate driver GDb.

Figure 13:
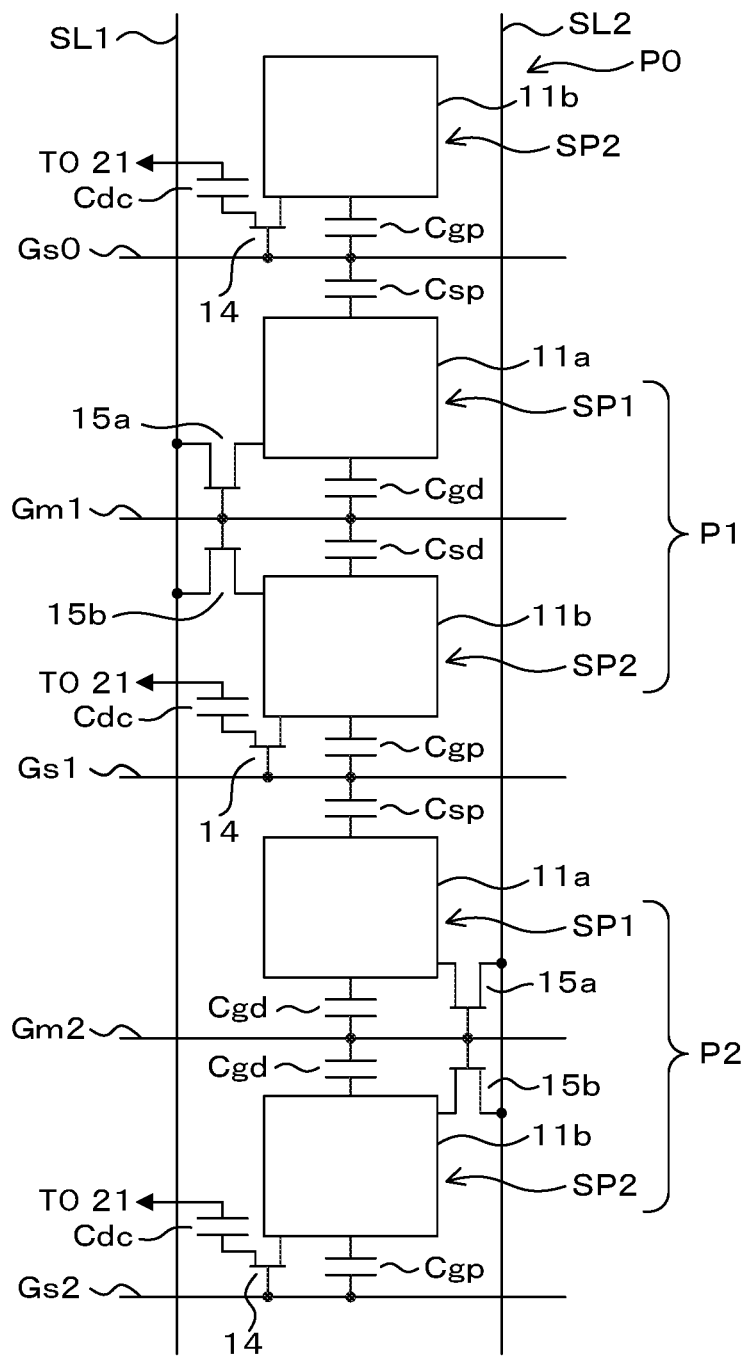
FIG. 13 is an explanatory diagram illustrating the connection relationship between a pixel and a source signal line.

FIG. 13 is an explanatory diagram illustrating the connection relationship between the pixel P and the source signal line SL1 or SL2. Since the parasitic capacitance associated with the pixel P is the same as that illustrated in FIG. 4 of Embodiment 1, the description thereof will be omitted. Source electrodes of the TFTs 15a and 15b of the pixels P1, P3, P5, . . . are connected to the source signal line SL1. Source electrodes of the TFTs 15a and 15b of the pixels P2, P4, P6, . . . are connected to the source signal line SL2. That is, data signals that are different alternately for respective lines are applied from the source signal lines SL1 and SL2 to the subpixel electrodes 11a and 11b through the TFTs 15a and 15b. With this configuration, by simultaneously turning on the scanning signals from the scanning signal lines Gm1 and Gm2, it is possible to simultaneously scan two lines including the pixels P1 and P2 within 1 H (horizontal scanning period).

In the present Embodiment 2, the discharge signals from the discharge signal lines Gs1 and Gs2 are simultaneously turned on, but it is the same as in Embodiment 1 that it is necessary to prevent these discharge signals from overlapping the scanning signals from the scanning signal lines Gm1 and Gm2. As long as this condition is cleared with margin, the subpixel electrode 11b of the subpixel SP2 of each of the pixels P1 and P2 is almost equally influenced by push-up and push-down from the discharge signal lines Gs1 and Gs2 through the parasitic capacitance Cgp, which is present between the subpixel electrode 11b of the subpixel SP2 of each of the pixels P1 and P2 and each of the discharge signal lines Gs1 and Gs2. Therefore, basically no counter voltage deviation occurs for the second subpixel SP2 of each of the pixels P1 and P2.

On the other hand, for the first subpixel SP1 of the pixel P1, there is a possibility that the counter voltage deviation occurs in the configurations of the inventions disclosed in Non-Patent Document 1 and U.S. Pat. No. 8,952,877. In particular, in the case of scanning two lines simultaneously as in the present Embodiment 2, the scanning signals are the same, but the discharge signals affected by the first subpixel SP1 are different between the first line and the second line. Therefore, the counter voltage deviation is likely to occur remarkably in the first subpixel SP1 of the first line. As a result, white horizontal streaks are visible every two lines on the display screen.

Hereinafter, a specific example in which the problem of the present application is solved will be described.

Figure 14A:
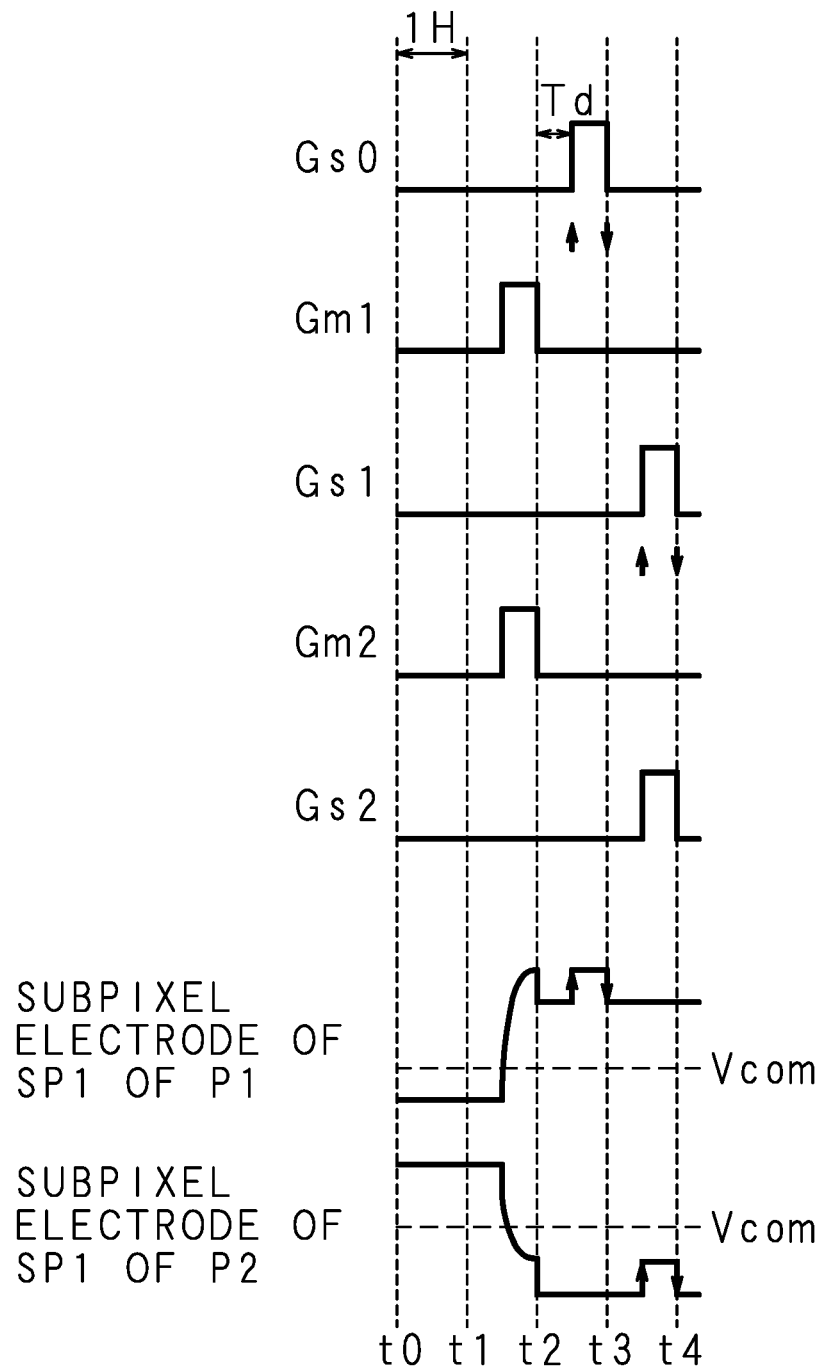
FIG. 14A is a timing chart illustrating temporal changes of a signal applied to each signal line and the voltage of a subpixel electrode in the liquid crystal display device according to Embodiment 2.
Figure 14B:
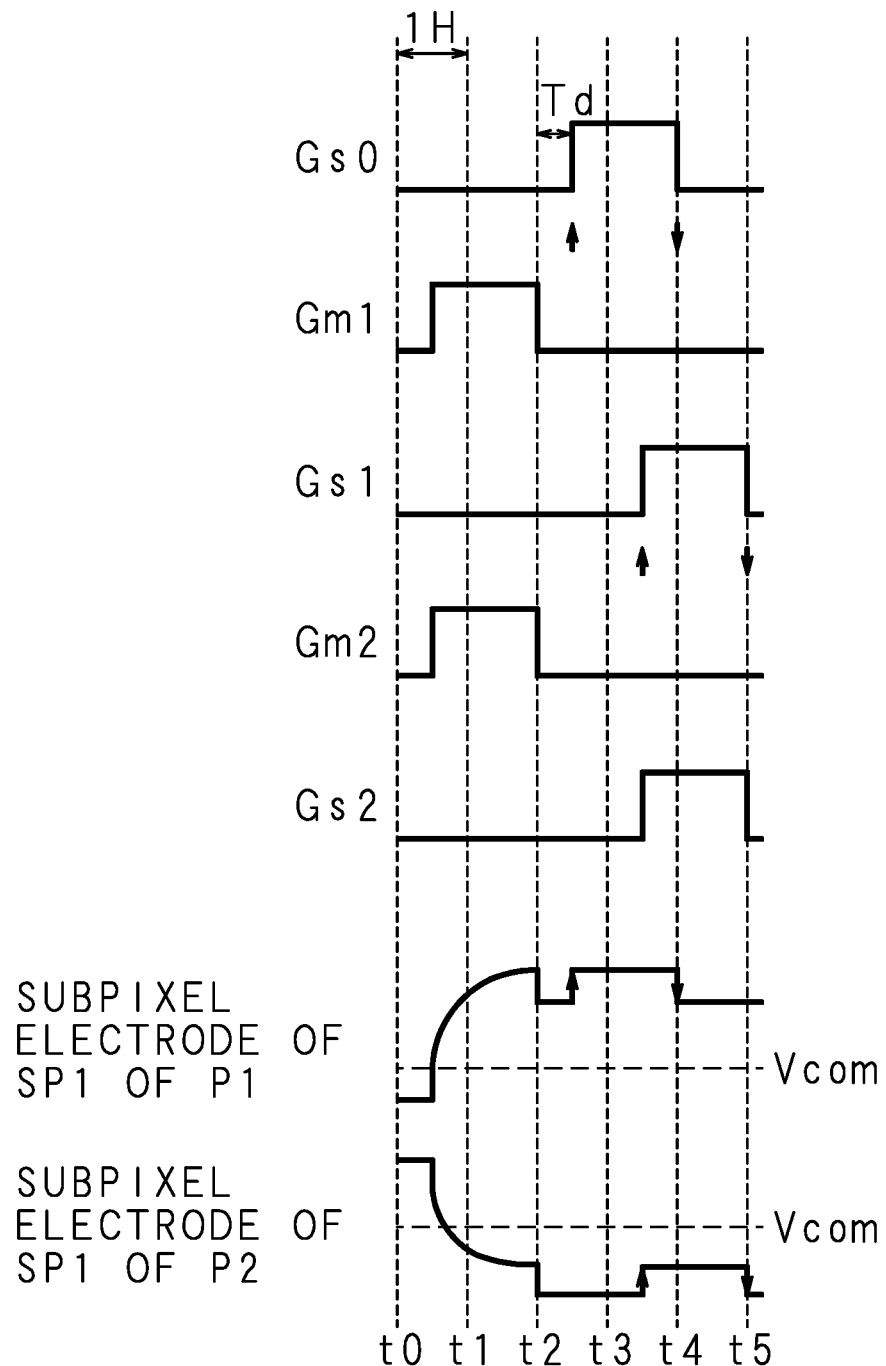
FIG. 14B is a timing chart illustrating temporal changes of a signal applied to each signal line and the voltage of a subpixel electrode in the liquid crystal display device according to Embodiment 2.

FIGS. 14A and 14B are timing charts illustrating temporal changes of a signal applied to each signal line and the voltage of the subpixel electrode 11a in the liquid crystal display device according to Embodiment 2. In seven timing charts illustrated in FIGS. 14A and 14B, all the horizontal axes indicate the same time axis, and the vertical axes indicate, from the top of the diagram, the signal level of the discharge signal line Gs0 of the 0-th line, the signal level of the scanning signal line Gm1 of the first line, the signal level of the discharge signal line Gs1 of the first line, the signal level of the scanning signal line Gm2 of the second line, the signal level of the discharge signal line Gs2 of the second line, the voltage level of the subpixel electrode 11a of the subpixel SP1 of the pixel P1, and the voltage level of the subpixel electrode 11a of the subpixel SP1 of the pixel P2. The signal level is expressed with an ON state as a positive pulse, and the voltage level is expressed as a potential difference with respect to the potential of the counter electrode 21, that is, a counter voltage Vcom. Each period between broken lines is 1 H.

FIG. 14A is different from FIG. 14B in that the signal widths of the scanning signal and the discharge signal are less than the length of 1 H in FIG. 14A while the signal widths of the scanning signal and the discharge signal are longer than the length of 1 H and less than the length of 2 H in FIG. 14B. The point that the scanning signal from the scanning signal line Gmk (k is an integer of 0 or more) is turned on simultaneously in two lines, the point that the scanning signal and the discharge signal are turned on with a delay of 1 H every two lines, and the point that the leading edge (rising edge in FIGS. 14A and 14B) of the discharge signal from the discharge signal line Gsk−1 is delayed by Td or more compared with the trailing edge (falling edge in FIGS. 14A and 14B) of the scanning signal from the scanning signal line Gmk are common in FIGS. 14A and 14B. This is the same for a case where the signal widths of the scanning signal and the discharge signal are longer than the length of 2 H.

In FIG. 14A, in a case where the scanning signals from the scanning signal lines Gm1 and Gm2 rise during a period from time t1 to t2 to turn on the TFTs 15a and 15b and then falls at time t2, the voltage level of the subpixel electrode 11a slightly decreases due to the influence of the pull-in phenomenon (feed-through). Thereafter, the discharge signal from the discharge signal line Gs0 (or Gs1) rises with a delay of Td or more, and the discharge signal falls at time t3 (or t4). During this period, the voltage level of the subpixel electrode 11a of the pixel P1 (or P2) is almost equally influenced by push-up and push-down due to the rising and falling of the discharge signal from the discharge signal line Gs0 (or Gs1). Therefore, the voltage level of the subpixel electrode 11a of the pixel P1 (or P2) is maintained at almost the same voltage as when there is no influence of these discharge signals.

Similarly in FIG. 14B, in a case where the scanning signals from the scanning signal lines Gm1 and Gm2 rise during a period from time t0 to t1 to turn on the TFTs 15a and 15b and then falls at time t2, the voltage level of the subpixel electrode 11a slightly decreases due to the influence of the pull-in phenomenon (feed-through). Thereafter, the discharge signal from the discharge signal line Gs0 (or Gs1) rises with a delay of Td or more, and the discharge signal falls at time t4 (or t5). During this period, the voltage level of the subpixel electrode 11a of the pixel P1 (or P2) is almost equally influenced by push-up and push-down due to the rising and falling of the discharge signal from the discharge signal line Gs0 (or Gs1). Therefore, the voltage level of the subpixel electrode 11a of the pixel P1 (or P2) is maintained at almost the same voltage as when there is no influence of these discharge signals.

Hereinafter, the result of measuring the counter voltage deviation when the Td is changed and the visual effect of the present invention will be described.

Figure 15:
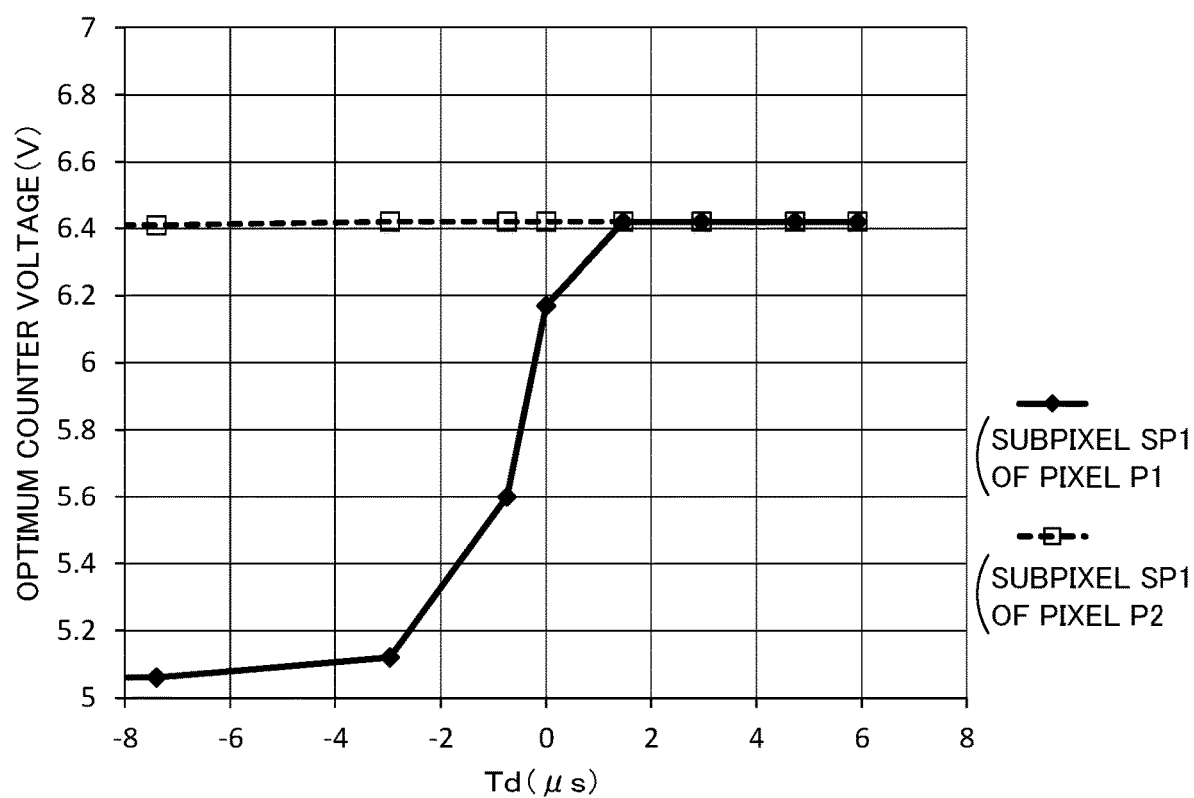
FIG. 15 is a graph showing the relationship between the delay time of a discharge signal and an optimum counter voltage.

FIG. 15 is a graph showing the relationship between the delay time of the discharge signal and the optimum counter voltage, and FIG. 16 is an explanatory diagram for describing the presence or absence of horizontal streaks caused by the counter voltage deviation. In FIG. 15, the horizontal axis indicates the delay time (µs) of the leading edge of the discharge signal before one line with respect to the trailing edge of the scanning signal, and the vertical axis indicates the optimum counter voltage (V). Here, the liquid crystal display device used for the measurement is a full HD with a frame rate of 120 Hz, and the measurement was performed for a case where the displayed gray scale was 64/255. The solid line indicates an optimum counter voltage for the subpixel SP1 of the pixel P1, and the broken line indicates an optimum counter voltage for the subpixel SP1 of the pixel P2 shown for comparison. In addition, a case where the value of Td is negative indicates that the rising edge of the discharge signal of the pixel P0 precedes the falling edge of the scanning signal of the pixel P1 in time.

In the present Embodiment 2, the discharge signal for the pixel P0 rises with a delay of Td or more from the falling edge of the scanning signal for the pixel P1, and the discharge signal for the pixel P1 rises with a delay of 1 H+Td or more from the falling edge of the scanning signal for the pixel P2. For this reason, basically no counter voltage deviation occurs for the subpixel electrode 11a of the subpixel SP1 of the pixel P2, and the optimum counter voltage is fixed at approximately 6.4 V (refer to the broken line in FIG. 15).

On the other hand, for the subpixel electrode 11a of the subpixel SP1 of the pixel P1, when Td is changed to −7.4 µs, −3.0 µs, −0.74 µs, ±0 µs, and +1.5 µs, the optimum counter voltage is changed to 5.05 V, 5.12 V, 5.60 V, 6.17 V, and 6.42 V. That is, it can be said that the counter voltage deviation still occurs when Td is 0 µs and the counter voltage deviation is eliminated when Td of 1.5 µs or more is secured.

In addition, when the value of Td that can prevent the counter voltage deviation differs depending on a position on the display screen, the maximum Td may be adopted.

Returning to FIG. 16, the upper portion of the diagram shows the display screen of the liquid crystal panel 100c when the counter voltage deviation occurs, and the lower portion shows the display screen of the liquid crystal panel 100c when no counter voltage deviation occurs. Since the brightness change of the pixel P with respect to the gradation change is nonlinear, it is known that the brightness of the pixel P tends to shift toward the brighter side than the ideal brightness when the counter voltage deviation occurs. For this reason, when a uniform halftone screen is displayed, white horizontal streaks are visible every two lines on the display screen (refer to the upper diagram). On the other hand, when no counter voltage deviation occurs, white horizontal streaks are not visible on the display screen (refer to the lower diagram).

As described above, according to the present Embodiment 2, the signal width of the scanning signal is within a range from M times (M is 0 or 1) the length of 1 H to (M+1) times, and the discharge signal line Gs for applying the discharge signal to each line is connected to the scanning signal line Gm behind 2N lines, which is scanned after N horizontal scanning periods (N is M+2, that is, 2 or 3), by the signal-to-signal connection line Wsm.

Therefore, after a point in time at which no data signal is applied to the subpixel electrodes 11a and 11b of the first subpixel SP1 and the second subpixel SP2 of each line, the discharge signal is applied to the gate electrode of the TFT 14 of the previous line. As a result, for the voltage applied to the liquid crystal layer 3 by the first subpixel SP1 and the second subpixel SP2 that the pixel P of each line has at least, influences of the rising and falling of the discharge signal of the previous line are canceled out.

Therefore, it is possible to prevent the counter voltage, which is optimal for the counter electrode 21 that the subpixel electrodes 11a and 11b defining the pixel P face, from deviating from the preset counter voltage.

In addition, according to Embodiment 2, data signals that are different alternately for respective lines are applied from the two source signal lines SL1 and SL2, which are arranged for each column of the matrix, to the subpixel electrode 11a of the first subpixel SP1 and the subpixel electrode 11b of the second subpixel SP2 through the TFTs 15a and 15b, and the scanning signals of two adjacent lines are simultaneously turned on.

Therefore, it is possible to scan two lines within one horizontal scanning period, and it is possible to prevent the counter voltage deviation even in the configuration in which the counter voltage deviation is likely to occur in the subpixel SP1 of the pixel P of the first line between two lines scanned simultaneously.

Modification Example 4

The signal widths of the scanning signal and the discharge signal are set to lengths different from an integral multiple of the length of 1 H in Embodiment 1, whereas the signal widths of the scanning signal and the discharge signal are set to the length of approximately 1 H in Modification Example 4 of Embodiment 2. In the present Modification Example 4, when the effect of the present invention is reduced because Td illustrated in FIGS. 14A and 14B of Embodiment 2 is shorter than a predetermined time, an effective solution is presented.

Figure 17:
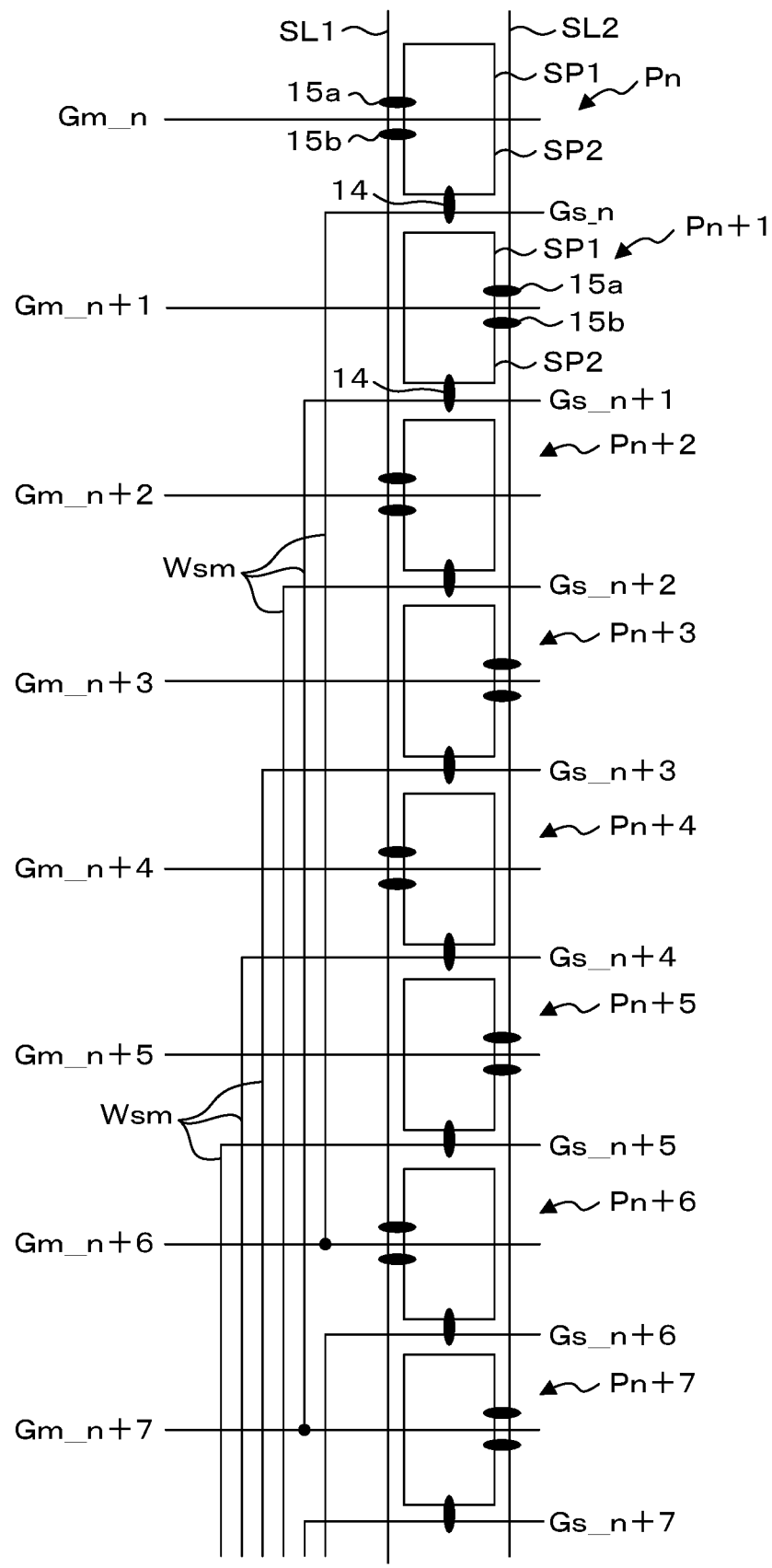
FIG. 17 is an explanatory diagram illustrating a connection example of a signal-to-signal connection line in a liquid crystal panel according to Modification Example 4 of Embodiment 2.
Figure 18:
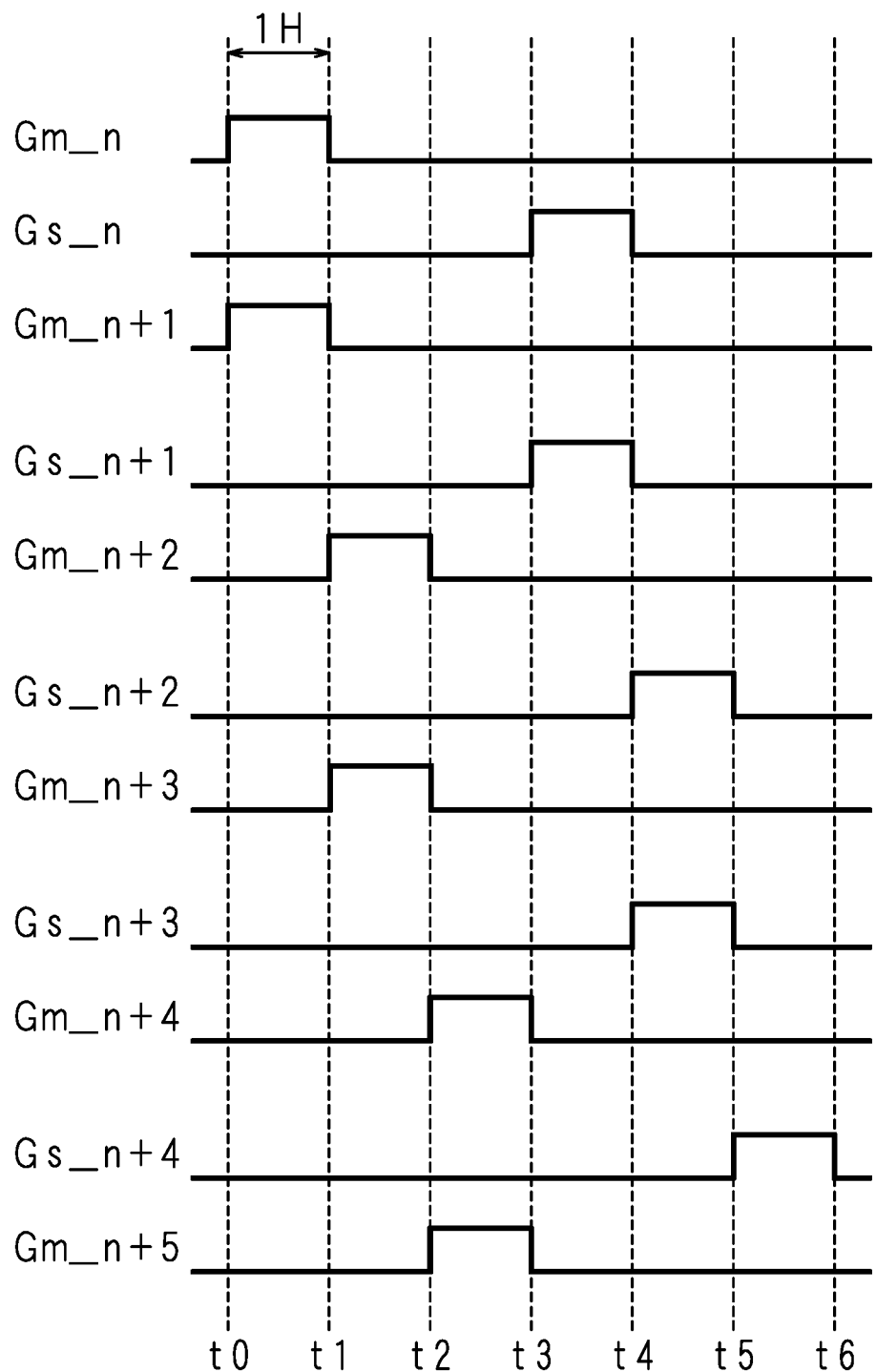
FIG. 18 is a timing chart illustrating temporal changes of a scanning signal and a discharge signal in the liquid crystal panel according to Modification Example 4 of Embodiment 2.

FIG. 17 is an explanatory diagram illustrating a connection example of the signal-to-signal connection line Wsm in the liquid crystal panel according to Modification Example 4 of Embodiment 2, and FIG. 18 is a timing chart illustrating temporal changes of the scanning signal and the discharge signal in the liquid crystal panel according to Modification Example 4 of Embodiment 2. Since the liquid crystal panel in the present Modification Example 4 is different from the liquid crystal panel 100c of Embodiment 2 only in the connection destination of the signal-to-signal connection line Wsm, the same reference numerals are given and illustration thereof will be omitted. Hereinafter, the same configurations as in Embodiment 2 are denoted by the same reference numerals and the description thereof will be omitted, and a configuration different from Embodiment 2 will be described.

In FIG. 17, for the sake of explanation, the pixel P of the n-th line (n is a natural number), the scanning signal line Gm of the n-th line, and the discharge signal line Gs of the n-th line are denoted by Pn, Gm_n, and Gs_n, respectively. In addition, the reference numerals of the subpixels SP1 and SP2 and the reference numerals of the TFTs 15a, 15b, and 14 are displayed only for the pixel Pn of the n-th line and the pixel Pn+1 of the (n+1)-th line among the pixels Pn, Pn+1, . . . , Pn+5. The TFTs 15a, 15b, and 14 are expressed by ellipses filled with black for simplicity. The discharge signal lines Gs_n and Gs_n+1 are separately connected to the scanning signal lines Gm_n+6 and Gm_n+7 behind six lines, which are scanned after three horizontal scanning periods, by the signal-to-signal connection line Wsm. This is the same for the discharge signal lines Gs_n+2, Gs_n+3, . . . , Gs_n+7 whose connection destinations are not illustrated. The signal-to-signal connection line Wsm intersects with five scanning signal lines Gm at the edge portion 101c of the liquid crystal panel 100c.

Returning to FIG. 18, in eleven timing charts illustrated in the diagram, all the horizontal axes indicate the same time axis, and the vertical axes indicate, from the top of the diagram, the signal levels of the scanning signal line Gm_n and the discharge signal line Gs_n of the n-th line, the signal levels of the scanning signal line Gm_n+1 and the discharge signal line Gs_n+1 of the (n+1)-th line, . . . , the signal levels of the scanning signal line Gm_n+4 and the discharge signal line Gs_n+4 of the (n+4)-th line, and the signal level of the scanning signal line Gm_n+5 of the (n+5)-th line. The signal level is expressed with an ON state as a positive pulse. Each period between broken lines is 1 H. The signal widths of the scanning signal and the discharge signal are each approximately 1 H in length. The scanning signal is generated so as to be delayed by 1 H every two lines.

Due to the connection illustrated in FIG. 17, in FIG. 18, the discharge signal is delayed by 3 H from the scanning signal for all lines. In a case where the scanning signals from the scanning signal lines Gm_n and Gm_n+1 (or Gm_n+2 and Gm_n+3 or Gm_n+4 and Gm_n+5) rise at time t0 (or time t1 or t2) to turn on the TFTs 15a and 15b and then falls at time t1 (or t2 or t3), the voltage level of the subpixel electrode 11a slightly decreases due to the influence of the pull-in phenomenon (feed-through).

Thereafter, the discharge signals from the discharge signal lines Gs_n and Gs_n+1 (or Gs_n+2 and Gs_n+3 or Gs_n+4 and Gs_n+5) rise with a delay of 2 H, and the discharge signals fall at time t4 (or t5 or t6). During this period, for example, the voltage level of the subpixel electrode 11a of each of the pixels Pn+2 and Pn+3 (or Pn+4 and Pn+5) is almost equally influenced by push-up and push-down due to the rising and falling of the discharge signals from the discharge signal lines Gs_n+1 and Gs_n+2 (or Gs_n+3 and Gs_n+4). Therefore, since the voltage level of the subpixel electrode 11a of each of the pixels Pn+2 and Pn+3 (or Pn+4 and Pn+5) is maintained at almost the same voltage as when there is no influence of these discharge signals, the counter voltage deviation is prevented.

In general, when the signal widths of the scanning signal and the discharge signal are longer than a length, which is obtained by subtracting a predetermined time (for example, 2 µs described above) from the length of 1 H, and shorter than the length of 1 H, the discharge signal line Gs of each line may be connected to the scanning signal line Gm behind six lines that is scanned after 3 H. When the signal widths of the scanning signal and the discharge signal are longer than a length, which is obtained by subtracting a predetermined time from (M+1) times (M is an integer of 0 or more) the length of 1 H, and shorter than (M+1) times the length of 1 H, the discharge signal line Gs of each line may be connected to the scanning signal line Gm behind (M+6) lines or more.

Hereinafter, the result of measuring the counter voltage deviation when the connection destination of the discharge signal line Gs connected to the scanning signal line Gm of the rear line is changed will be described.

FIG. 19 is a graph showing the relationship between the connection destination of the discharge signal line Gs_n and the optimum counter voltage difference. In the diagram, the horizontal axis indicates the scanning signal line Gm connected to the discharge signal line Gs_n through the signal-to-signal connection line Wsm, and the vertical axis indicates the optimum counter voltage difference (V). The optimum counter voltage difference shown on the vertical axis is a difference between the optimum counter voltage for the subpixel SP1 of the pixel Pn+3 and the optimum counter voltage for the subpixel SP1 of the pixel Pn+2. The pixels Pn+2 and Pn+3 are included in two lines scanned simultaneously. Here, the liquid crystal display device used for the measurement is a full HD with a frame rate of 120 Hz, and the measurement was performed for a case where the signal widths of the scanning signal and the discharge signal were the length of 1 H and the displayed gray scale was 64/255.

In the present Modification Example 4, the discharge signal for the pixel Pn+1 rises with a delay of 1 H from the falling edge of the scanning signal for the pixel Pn+2, and the discharge signal for the pixel Pn+2 rises with a delay of 2 H from the falling edge of the scanning signal for the pixel Pn+3. For this reason, for the subpixel electrode 11a of the subpixel SP1 of the pixel Pn+3, for example, when Gs_n is connected to Gm_n+4 (or Gm_n+6) and Gs_n+2 is connected to Gm_n+6 (or Gm_n+8), basically no counter voltage deviation occurs. However, when Gs_n is connected to Gm_n+2 and Gs_n+2 is connected to Gm_n+4, the falling of the scanning signal for the pixel Pn+3 and the rising of the discharge signal for the pixel Pn+2 almost simultaneously occur, and the optimum counter voltage decreases by 0.25 V.

On the other hand, for the subpixel electrode 11a of the subpixel SP1 of the pixel Pn+2, when the connection destination of the discharge signal line Gs_n is changed to the scanning signal lines Gm_n+6, Gm_n+4, and Gm_n+2 (that is, when the connection destination of the discharge signal line Gs_n+1 is changed to the scanning signal lines Gm_n+7, Gm_n+5, and Gm_n+3), the optimum counter voltage decreases by 0 V, 0.25 V, and 1.40 V. That is, the above-described optimum counter voltage difference is −1.15 V (difference between −1.40 V and −0.25 V described above) when the connection destination of the discharge signal line Gs_n is the scanning signal line Gm_n+2, the optimum counter voltage difference decreases to −0.25 V when the connection destination of the discharge signal line Gs_n is the scanning signal line Gm_n+4, and the optimum counter voltage difference becomes 0 V corresponding to the timing illustrated in FIG. 18 when the connection destination of the discharge signal line Gs_n is the scanning signal line Gm_n+6, so that the counter voltage deviation is also eliminated.

As described above, according to the present Modification Example 4, the signal widths of the scanning signal and the discharge signal are longer than a length, which is obtained by subtracting the predetermined time Td from (M+1) times (M is an integer of 0 or more) the length of 1 H, and shorter than (M+1) times the length of 1 H, and the discharge signal line Gs is connected to the scanning signal line Gm of a row, which is scanned after L horizontal scanning periods (L is M+3 or more, that is, 3 or more), by the signal-to-signal connection line Wsm.

Therefore, since the discharge signal line Gs is connected to the scanning signal line Gm behind 2L lines, which is scanned after L horizontal scanning periods (L is an integer larger by 1 than the above N), it is possible to avoid the application of the discharge signal to the gate electrode of the TFT 14 of the previous line within a predetermined time from the point in time at which no data signal is applied to the subpixel electrodes 11a and 11b of the first subpixel SP1 and the second subpixel SP2 of each line. As a result, the counter voltage deviation is prevented.

In addition, according to Modification Example 4, the scanning signal line Gm and the signal-to-signal connection line Wsm are wired in the edge portion 101c on one side of the liquid crystal panel 100c, and the signal-to-signal connection line Wsm intersects with the (2N−1) (=5) scanning signal lines Gm at the edge portion 101c.

That is, the signal-to-signal connection line Wsm connects the discharge signal line Gs and the scanning signal line Gm behind 2N lines, which is scanned after N (=3) horizontal scanning periods, to each other in a one-to-one manner, and the scanning signal is applied to the scanning signal line Gm of each line from the edge portion 101c side on which the signal-to-signal connection line Wsm is wired. Accordingly, the signal-to-signal connection line Wsm and the (2N−1) scanning signal lines Gm inevitably intersect with each other at the edge portion 101c on one side of the liquid crystal panel 100c.

Modification Example 5

The scanning signal is separately applied to each scanning signal line Gm and each discharge signal line Gs is separately connected to the rear scanning signal line Gm in Embodiment 2 and Modification Example 4 of Embodiment 2, whereas the scanning signal lines Gm and Gm are connected to each other and the discharge signal lines Gs and Gs are connected to each other for two rows scanned simultaneously and the common scanning signal is applied to the scanning signal lines Gm and Gm connected to each other in Modification Example 5 of Embodiment 2.

Figure 21:
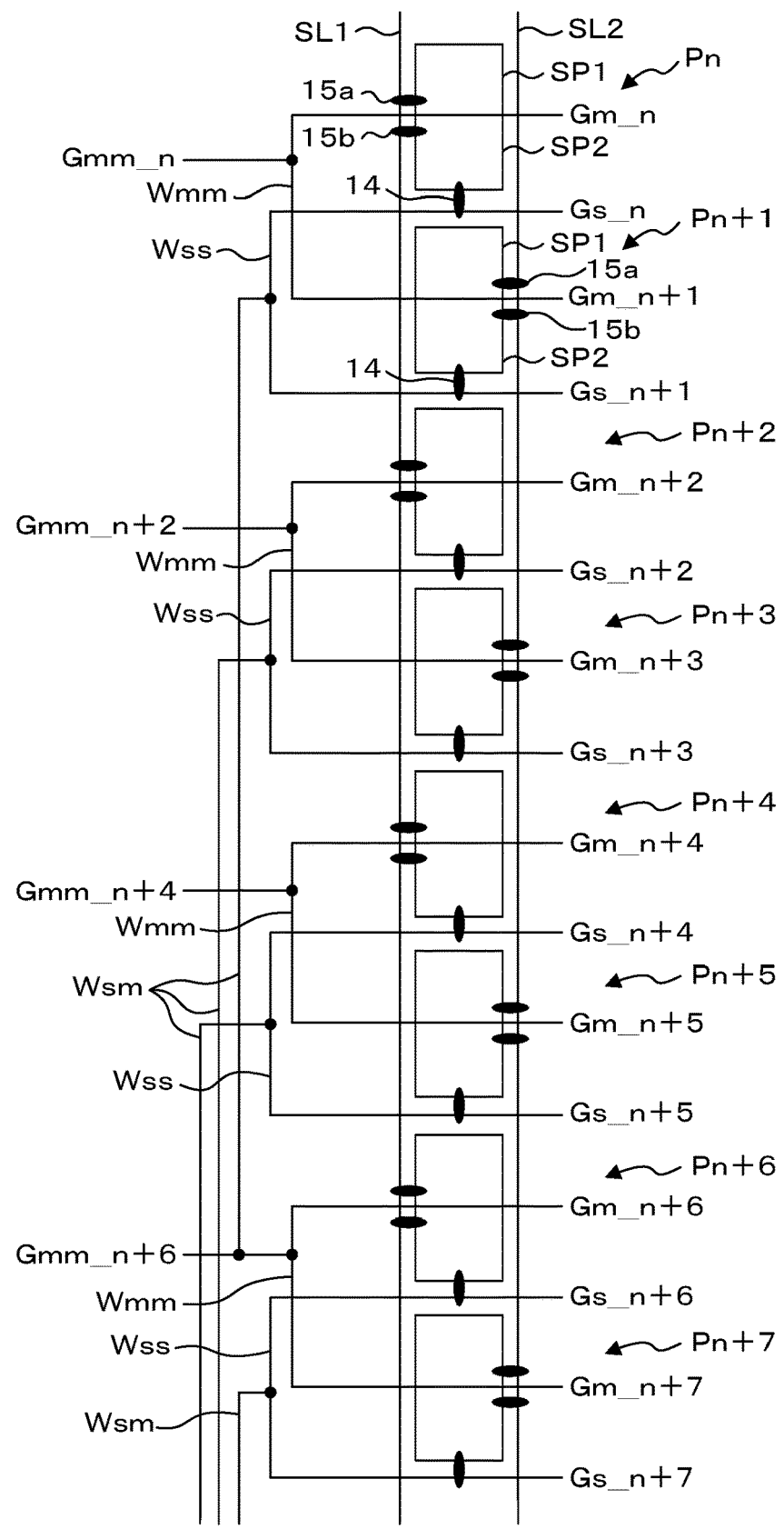
FIG. 21 is an explanatory diagram illustrating a connection example of a signal-to-signal connection line in a liquid crystal panel according to Modification Example 5 of Embodiment 2.

FIG. 20 is a block diagram illustrating an example of the configuration of a liquid crystal display device according to Modification Example 5 of Embodiment 2 of the present invention, and FIG. 21 is an explanatory diagram illustrating a connection example of the signal-to-signal connection line Wsm in a liquid crystal panel according to Modification Example 5 of Embodiment 2. The liquid crystal display device according to the present Modification Example 5 includes a liquid crystal panel 100d, a gate driver GDc, a source driver SDb, and a display control circuit 4d for controlling the display of the liquid crystal panel 100d using the gate driver GDc and the source driver SDb. Hereinafter, the same configurations as in Embodiment 2 and Modification Example 4 of Embodiment 2 are denoted by the same reference numerals and the majority of the description thereof will be omitted, and a configuration different from Embodiment 2 and Modification Example 4 of Embodiment 2 will be mainly described.

In the liquid crystal panel 100d, for two lines scanned simultaneously, the scanning signal lines Gm and Gm are connected to each other by a scanning signal connection line Wmm, and the discharge signal lines Gs and Gs are connected to each other by a discharge signal connection line Wss. In an edge portion 101d on one side of the liquid crystal panel 100d, a common scanning signal line Gmm for applying a common scanning signal to the scanning signal connection line Wmm is separately wired. In addition, in the edge portion 101d, the signal-to-signal connection line Wsm connecting each discharge signal connection line Wss and the common scanning signal line Gmm, to which a scanning signal is applied after three horizontal scanning periods, to each other is separately wired (refer to FIG. 21).

The display control circuit 4d is different from the display control circuit 4c in Embodiment 2 in that a scanning signal control circuit 42c controls one common scanning signal line Gmm every two rows of the matrix using the gate driver GDc.

In FIG. 21, similarly to the case of Modification Example 4, the pixel P of the n-th line (n is a natural number), the scanning signal line Gm of the n-th line, and the discharge signal line Gs of the n-th line are denoted by Pn, Gm_n, and Gs_n, respectively. The common scanning signal line common to the n-th line and the (n+1)-th line is denoted by Gmm_n. The omission of reference numerals and the display method of the TFTs 15a, 15b, and 14 are the same as those in the case of FIG. 17 in Modification Example 4. The signal-to-signal connection line Wsm intersects with two common scanning signal lines Gmm at the edge portion 101d of the liquid crystal panel 100d.

As described above, according to the present Modification Example 5, the scanning signal lines Gm and Gm are connected to each other by the scanning signal connection line Wmm and the discharge signal lines Gs and Gs are connected to each other by the discharge signal connection line Wss for two lines scanned simultaneously, and the common scanning signal line Gmm for applying the scanning signal to the scanning signal connection line Wmm and the signal-to-signal connection line Wsm connecting the discharge signal connection line Wss and the scanning signal connection line Wmm to each other are wired in the edge portion 101d of the liquid crystal panel 100d. In addition, the signal-to-signal connection line Wsm intersects with (N−1) common scanning signal lines Gmm at the edge portion 101d.

That is, the signal-to-signal connection line Wsm connects the discharge signal connection line Wss and the scanning signal connection line Wmm, which makes a connection between two lines scanned after N (=3) horizontal scanning periods, to each other in a one-to-one manner, and the scanning signal is applied to each common scanning signal line Gmm from the edge portion 101d side on which the signal-to-signal connection line Wsm is wired. Accordingly, the signal-to-signal connection line Wsm and the (N−1) scanning signal lines Gmm inevitably intersect with each other at the edge portion 101*d* on one side of the liquid crystal panel 100*d*.

It is to be noted that, as used herein and in the appended claims, the singular forms "a", "an", and "the" include plural referents unless the context clearly dictates otherwise.

The embodiments disclosed this time are examples in all respects, and should be considered to be not restrictive. The scope of the present invention is not limited to the above-described meaning but is indicated by the claims, and it is intended that all modifications within the meaning and scope equivalent to the claims are included. In addition, the technical features described in the respective embodiments can be combined with each other.

The invention claimed is:

1. A liquid crystal display apparatus comprising:
pixels which are arranged in a matrix and each of which has at least first and second subpixels defined to include an electrode pair of a subpixel electrode and a counter electrode facing each other with a liquid crystal layer interposed therebetween;
first and second switching elements for applying a data signal to subpixel electrodes included in the first and second subpixels;
a scanning signal line for applying a scanning signal to control electrodes of the first and second switching elements for each row of the matrix;
an electrode pair of a discharge capacitor electrode included in the second subpixel and a discharge capacitor counter electrode connected to a predetermined potential;
a third switching element connected between the discharge capacitor electrode and the subpixel electrode of the second subpixel; and
a discharge signal line for applying a discharge signal for turning on the third switching element to a control electrode of the third switching element for each row of the matrix,
wherein a leading edge of the discharge signal applied to one pixel is delayed by a predetermined time or more compared with a trailing edge of a scanning signal which rises after a scanning signal applied to the one pixel, and
wherein the signal width of the scanning signal is shorter than the length of one horizontal scanning period,
the liquid crystal display apparatus further comprising:
a signal-to-signal connection line connecting the discharge signal line to a scanning signal line of a row, which is scanned after N horizontal scanning periods (N is an integer of 2 or more);
two data signal lines for applying data signals, which are different alternately for respective rows of the matrix, to one end of each of the first and second switching elements for each column of the matrix;
a scanning signal connection line connecting scanning signal lines to each other for the two rows and a discharge signal connection line which connects discharge signal lines to each other for the two rows and is connected to the signal-to-signal connection line;
a common scanning signal line for applying a scanning signal common to the two rows to the scanning signal connection line; and
a liquid crystal panel in which the signal-to-signal connection line and the common scanning signal line are wired in an edge portion,
wherein two adjacent rows are simultaneously scanned and the signal-to-signal connection line is wired in common to the two rows, and intersects with (N−1) common scanning signal lines.

2. A liquid crystal display apparatus comprising:
pixels which are arranged in a matrix and each of which has at least first and second subpixels defined to include an electrode pair of a subpixel electrode and a counter electrode facing each other with a liquid crystal layer interposed therebetween;
first and second switching elements for applying a data signal to subpixel electrodes included in the first and second subpixels;
a scanning signal line for applying a scanning signal to control electrodes of the first and second switching elements for each row of the matrix;
an electrode pair of a discharge capacitor electrode included in the second subpixel and a discharge capacitor counter electrode connected to a predetermined potential;
a third switching element connected between the discharge capacitor electrode and the subpixel electrode of the second subpixel; and
a discharge signal line for applying a discharge signal for turning on the third switching element to a control electrode of the third switching element for each row of the matrix,
wherein a leading edge of the discharge signal applied to one pixel is delayed by a predetermined time or more compared with a trailing edge of a scanning signal which rises after a scanning signal applied to the one pixel, and
wherein the signal width of the scanning signal is M times (M is an integer of 1 or more) the length of one horizontal scanning period or more and shorter than (M+1) times,
the liquid crystal display apparatus further comprising:
a signal-to-signal connection line connecting the discharge signal line to a scanning signal line of a row, which is scanned after N horizontal scanning periods (N is an integer of M+2 or more);
two data signal lines for applying data signals, which are different alternately for respective rows of the matrix, to one end of each of the first and second switching elements for each column of the matrix;
a scanning signal connection line connecting scanning signal lines to each other for the two rows and a discharge signal connection line which connects discharge signal lines to each other for the two rows and is connected to the signal-to-signal connection line;
a common scanning signal line for applying a scanning signal common to the two rows to the scanning signal connection line; and
a liquid crystal panel in which the signal-to-signal connection line and the common scanning signal line are wired in an edge portion,
wherein two adjacent rows are simultaneously scanned and the signal-to-signal connection line is wired in common to the two rows, and intersects with (N−1) common scanning signal lines.

\* \* \* \* \*